US008673537B2

(12) United States Patent
Furuya et al.

(10) Patent No.: US 8,673,537 B2
(45) Date of Patent: *Mar. 18, 2014

(54) PHOTO-CURABLE RESIN COMPOSITION, PATTERN FORMING METHOD AND SUBSTRATE PROTECTING FILM, AND FILM-SHAPED ADHESIVE AND ADHESIVE SHEET USING SAID COMPOSITION

(75) Inventors: Masahiro Furuya, Annaka (JP); Michihiro Sugo, Annaka (JP); Hideto Kato, Annaka (JP); Kazunori Kondo, Annaka (JP); Shohei Tagami, Annaka (JP); Tomoyuki Goto, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 268 days.

This patent is subject to a terminal disclaimer.

(21) Appl. No.: 12/963,727

(22) Filed: Dec. 9, 2010

(65) Prior Publication Data
US 2011/0143103 A1    Jun. 16, 2011

(30) Foreign Application Priority Data

Dec. 10, 2009 (JP) ................ P2009-280569
Dec. 10, 2009 (JP) ................ P2009-280570

(51) Int. Cl.
*G03F 7/004* (2006.01)
*G03F 7/038* (2006.01)

(52) U.S. Cl.
CPC ......... *G03F 7/0387* (2013.01); *Y10S 430/107* (2013.01)
USPC ............... 430/270.1; 430/273.1; 430/906

(58) Field of Classification Search
CPC ................................. G03F 7/0387
USPC ................... 430/270.1, 273.1, 906
See application file for complete search history.

(56) References Cited

U.S. PATENT DOCUMENTS

| 3,957,512 | A | 5/1976 | Kleeberg et al. |
| 4,243,743 | A | 1/1981 | Hiramoto et al. |
| 4,395,482 | A | 7/1983 | Ahne et al. |
| 6,001,534 | A | 12/1999 | Kato |
| 7,485,405 | B2 * | 2/2009 | Kato et al. ............... 430/270.1 |
| 8,263,308 | B2 * | 9/2012 | Tagami et al. ............ 430/270.1 |
| 2006/0079658 | A1 | 4/2006 | Kato et al. |
| 2007/0197680 | A1 | 8/2007 | Sugo et al. |
| 2008/0057446 | A1 | 3/2008 | Goto et al. |
| 2008/0176167 | A1 | 7/2008 | Kawamori et al. |
| 2010/0297439 | A1 | 11/2010 | Takayama et al. |

FOREIGN PATENT DOCUMENTS

| EP | 0424940 B1 | 1/1998 |
| JP | 49-115541 | 11/1974 |
| JP | 54-145794 A | 11/1979 |
| JP | 55-45746 A | 3/1980 |
| JP | 1-46862 B2 | 10/1989 |
| JP | 3-209478 A | 9/1991 |
| JP | 5-202188 A | 8/1993 |
| JP | 6-73338 A | 3/1994 |
| JP | 10-265571 A | 10/1998 |
| JP | 10-274850 A | 10/1998 |
| JP | 11-65107 A | 3/1999 |
| JP | 2001-335619 A | 12/2001 |
| JP | 2006-133757 A | 5/2006 |
| JP | 2006-323089 A | 11/2006 |
| JP | 2008-274269 A | 11/2008 |
| JP | 2009-9110 A | 1/2009 |
| JP | 2009-20246 A | 1/2009 |
| JP | 2009-167381 A | 7/2009 |
| JP | 2009-244628 A | 10/2009 |
| WO | WO 2007/004569 A1 | 1/2007 |

OTHER PUBLICATIONS

Cella et al., "Siloxane Equilibration during the Condensation Reactions of Organosilicon Functional Amines and Anhydrides," Macromolecules, American Chemical Society, Washington DC, vol. 25, No. 23, pp. 6355-6360 (1992).
Extended European Search Report issued May 7, 2012, in European Patent Application No. 10252090.5.

* cited by examiner

*Primary Examiner* — John Chu
(74) *Attorney, Agent, or Firm* — Birch, Stewart, Kolasch & Birch, LLP

(57) ABSTRACT

The invention relates to a photo-curable resin composition, which contains a polyimide silicone having a primary alcoholic hydroxyl group, as a component (A); at least one compound selected from the group consisting of an amino condensation product modified with formalin or a formalin-alcohol and a phenol compound having two or more in average of methylol group or alkoxymethylol group in one molecule thereof, as a component (B); and a photo-acid generator as a component (C). When used as an adhesive, the photo-curable resin composition further contains a multi-functional epoxy compound as a component (D).

18 Claims, 2 Drawing Sheets

PHOTO-CURABLE RESIN COMPOSITION, PATTERN FORMING METHOD AND SUBSTRATE PROTECTING FILM, AND FILM-SHAPED ADHESIVE AND ADHESIVE SHEET USING SAID COMPOSITION

FIELD OF THE INVENTION

This invention relates to a photo-curable resin composition comprising a polyimide silicone and its pattern forming method, and further to a film for protecting wiring and the like using this composition. Particularly, due to its excellent heat resistance, chemical resistance, insulation performance and flexibility, it relates to applications such as a protecting and insulating film for semiconductor device, an insulating film for multilayer printed board, a soft solder protecting film, a cover lay film, an MEMS and the like.

In addition, the invention relates to a photo-curable resin composition which can form patterns and also has a function as an adhesive that can perform thermo compression bonding of substrates, and to a film-shaped adhesive and an adhesive sheet using the same.

BACKGROUND OF THE INVENTION

Up to now, as a photosensitive polyimide system material, there has been proposed a material which employs a polyamic acid (polyimide precursor), such as a material in which a photosensitive group is introduced into carboxyl group of polyamic acid via ester bonding (JP-A-49-115541, JP-A-55-45746), a material composed of polyamic acid and an amine compound having a photosensitive group (JP-A-54-145794) and the like. However, according to these proposals, since an imidation treatment at a high temperature of exceeding 300° C. is essential in order to obtain a polyimide film of interest after forming a patterned film, there was a problem in that the backing is limited and copper of the wiring is oxidized in order to withstand this high temperature.

As an improvement therefor, there has been proposed a photosensitive polyimide prepared using a solvent-soluble resin imitated in advance for the purpose of lowering the post-curing temperature (JP-A-10-274850, JP-A-10-265571 and JP-A-13-335619).

On the other hand, there has been proposed a positive type in which a polyimide backbone having phenolic hydroxyl group (JP-A-3-209478) or a polyamide backbone (JP-B-1-46862 and JP-A-11-65107) is combined with diazonaphthoquinone.

Also, regarding a product developed using a polyimide as the base resin and putting emphasis on the minute pattern formation, there is known a composition in which a side chain alcohol group of a ring-closed solvent-soluble polyimide and an alkoxy group-containing melamine compound undergo a photo-crosslinking by a photo-acid generator (JP-A-2006-133757).

However, all of the compositions described in JP-A-10-274850, JP-A-10-265571 and JP-A-13-335619 provide resins with photosensitivity making use of (meth)acrylic group, so that these could not become a material which satisfies all of the required characteristics because of a difficulty in improving resolution due to reasons based on the photo-curable mechanism, such as the aptness to receive oxygen damage, the aptness to cause membrane loss at the time of development, and the like.

In the case of the compositions described in JP-A-3-209478, JP-B-1-46862 and JP-A-11-65107, there were problems in that it is difficult to form a thick film of exceeding 10 μm in view of light permeability of the compositions, the resin molecular weight is small in order to secure the developing property, the original curing characteristics of the resins are difficult to obtain because the adding amount of diazonaphthoquinone as the photosensitive agent becomes large for the resins, and the like.

The composition described in JP-A-2006-133757 has a problem in that development cannot be carried out with an alkaline aqueous solution having fewer environmental loads.

In addition, in recent years, there is a demand in the field of wafer level semiconductor packaging techniques for a material which can form minute patterns and also has a function as an adhesive for attaching wafer substrates with each other. As such a curing resin composition which can form patterns, the following resins and their compositions have so far been reported.

For example, there has been reported a composition which contains a carboxyl group-containing polymer, a bismaleimide, an allyl group-containing polymer, an ethylenic unsaturated compound, an organic peroxide, a photopolymerization initiator and the like (JP-A-2006-323089). In addition, there has been reported a composition which contains a hydroxyl group- or carboxyl group-containing methacrylic modified bisphenol, an epoxy resin, a multifunctional acrylate and the like (JP-A-2009-9110).

Polyimide is famous as a resin which has high adhesiveness for silicon substrate and metal surface as well as heat resistance, and compositions using polyimide as the base resin have been reported (International Publication No. 2007/004569 and JP-A-2008-274269). Also, there has been reported a composition in which a carboxyl group-containing polyimide, an epoxy resin and a photo-base generator are combined (JP-A-2009-167381). In addition, regarding a product developed using a polyimide as the base resin and putting emphasis on the minute pattern formation, there is known by the aforementioned JP-A-2006-133757 a composition in which a side chain alcohol group of a ring-closed solvent-soluble polyimide and an alkoxy group-containing melamine compound undergo a photo-crosslinking by a photo-acid generator.

The compositions described in JP-A-2006-323089 and JP-A-2009-9110 are compositions which can perform patterning by an alkali development, but it cannot be said that they have sufficient performance regarding hardening ability, substrate adhering property at high temperature and reliability.

The compositions described in International Publication No. 2007/004569 and JP-A-2008-274269 are compositions composed of a polyimide having carboxyl group in the side chain thereof, a multifunctional acrylic substance, a photopolymerization initiator and the like. However, since the curing system is a crosslinking by radical polymerization, there is a possibility of causing reaction inhibition due to oxygen and there is a problem in that patterning ability at high sensitivity is insufficient and residual film at the time of development is also insufficient.

The composition described in JP-A-2009-167381 undergoes epoxy crosslink curing by a base generated by light and is excellent in attachability at low temperature but is insufficient regarding the minute patterning ability. In addition, the composition described in JP-A-2006-133757 is excellent as a wiring protecting film, but its adhesiveness of attaching substrates is not sufficient.

SUMMARY OF THE INVENTION

The invention has been made by taking the above-mentioned circumstances into consideration, and it aims at providing a photo-curable resin composition comprising a polyimide silicone and a pattern forming method, which can easily carry out minute pattern formation with a film thickness of exceeding 20 μm by developing with an alkaline aqueous solution having fewer environmental loads, and also can provide a film having excellent film characteristics and reliability as a protecting film by a heating treatment at a relatively low temperature of 220° C. or less after this pattern formation.

In addition, the invention also aims at providing a composition which can faun a minute pattern, can strongly and accurately attach substrates such as silicon, glass and the like thereafter via this pattern layer by carrying out their thermo compression bonding and post-curing and also has various reliabilities; and a dry film thereof.

With the aim of achieving the above-mentioned objects, the present inventors have conducted intensive studies and found as a result that a photo-curable resin composition having a composition which is described later, that contains a polyimide silicone having a primary alcohol in the resin molecule thereof, can easily form a thin film without undergoing oxygen hindrance, can carry out exposure with a light of broad wavelength and can form a minute pattern by the pattern forming method which is described later, and further that this photo-curable resin composition and a cured film obtained therefrom by heating it after pattern formation are excellent in heat resistance and electrical insulation performance, thereby resulting in the accomplishment of the invention.

That is, the invention relates to the followings.

1. A photo-curable resin composition, which comprises:

as a component (A), a polyimide silicone having a primary alcoholic hydroxyl group;

as a component (B), at least one compound selected from the group consisting of an amino condensation product modified with formalin or a formalin-alcohol and a phenol compound having two or more in average of methylol group or alkoxymethylol group in one molecule thereof; and as a component (C), a photo-acid generator.

2. The photo-curable resin composition according to item 1, which comprises 100 parts by mass of the component (A), from 0.5 part by mass to 50 parts by mass of the component (B) and from 0.05 part by mass to 20 parts by mass of the component (C).

3. The photo-curable resin composition according to item 1 or 2, which further comprises from 50 parts by mass to 2,000 parts by mass of an organic solvent as a component (E), based on 100 parts by mass in total amount of the components (A) to (C).

4. The photo-curable resin composition according to any one of items 1 to 3, wherein the component (A) is a polyimidesilicone represented by the following general formula (1):

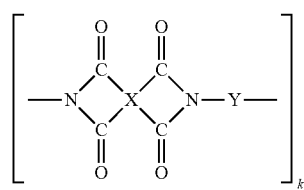

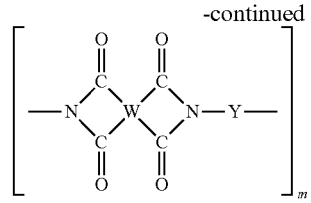

wherein k and m are each a positive integer, in which k and m satisfy a relation of $0.01 \leq k/(k+m) < 1$;

X is a tetravalent organic group represented by the following general formula (2):

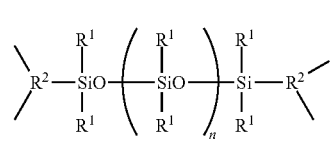

wherein $R^1$'s are each independently a monovalent hydrocarbon group having 1 to 8 carbon atoms, $R^2$'s are each independently a trivalent organic group, and n is a numeral of 1 to 120 in average;

Y's are each a divalent organic group and at least a part thereof is represented by the following general formula (3):

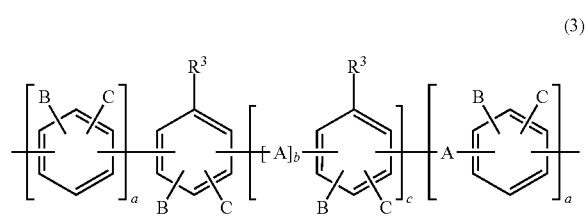

wherein A('s) is/are each a divalent organic group selected from:

—$CH_2$—, —O—, —$SO_2$—, —CONH—,

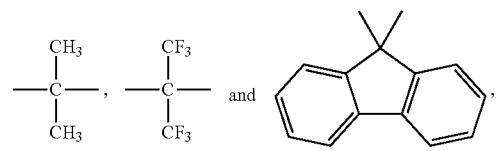

which may be the same or different from each other, B('s) and C('s) are each an alkyl group having 1 to 4 carbon atoms or a hydrogen atom, which may be the same or different from each other, a is 0 or 1, b is 0 or 1, c is an integer of 0 to 10, and $R^3$('s) is/are each a monovalent group selected from organic groups containing a phenolic hydroxyl group or an alcoholic hydroxyl group, in which at least one of $R^3$'s is an organic group containing a primary alcoholic hydroxyl group; and W is a tetravalent organic group other than X.

5. The photo-curable resin composition according to item 4, wherein the polyimidesilicone represented by the following general formula (1) is a polyimidesilicone represented by the following general formula (1-1):

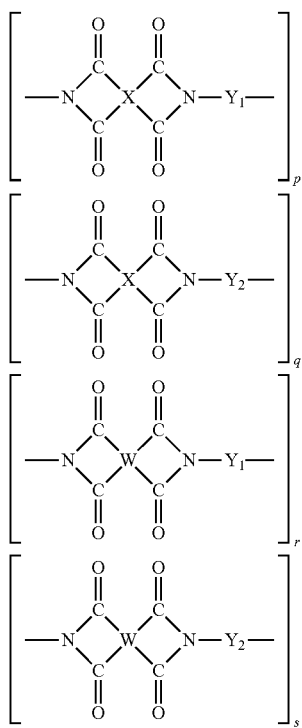

wherein

X and W are the same as above;

Y$_1$'s are each a divalent organic group represented by the general formula (3) and Y$_2$'s are each a divalent organic group other than the group represented by the general formula (3); and p and r are each a positive integer, and q and s are each 0 or a positive integer, in which p, q, r and s satisfy relations of p+q=k and r+s=m (wherein k and m are the same as above).

6. The photo-curable resin composition according to item 4 or 5, wherein in the general formula (3), at least one of R$^3$'s is a monovalent group selected from —OH, —OCH$_2$CH(OH)CH$_2$OH and —OCH(CH$_2$OH)CH$_2$OH.

7. The photo-curable resin composition according to any one of items 4 to 6, wherein in the general formula (1), W is one of tetravalent organic groups represented by the following formulae:

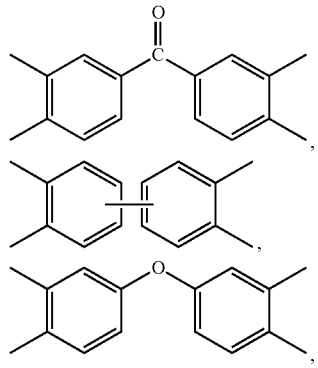

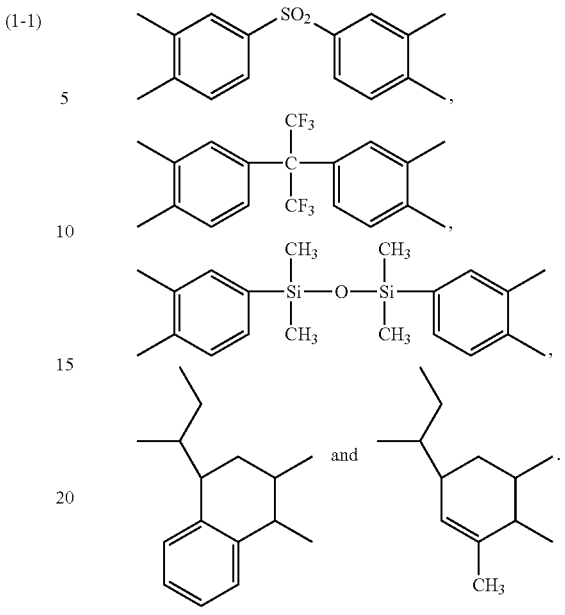

8. The photo-curable resin composition according to any one of items 4 to 7, wherein the polyimidesilicone has an OH value of 20 to 200 KOH mg/g.

9. The photo-curable resin composition according to any one of items 5 to 8, wherein in the general formula (1-1), Y$_2$'s are at least one selected from a divalent organic group represented by the following general formula (4):

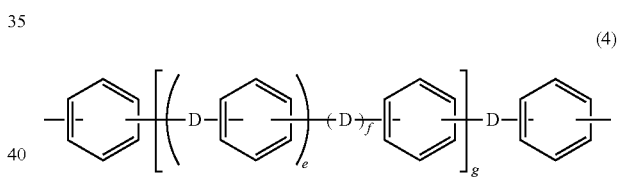

wherein D('s) is/are each independently any of the following divalent organic groups:

—CH$_2$—, —O—, —SO$_2$—, —CONH—,

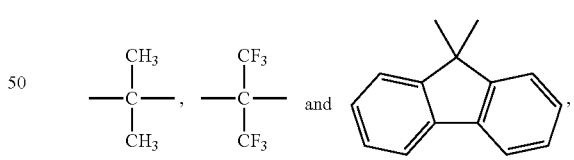

and
e and f are each independently 0 or 1 and g is 0 or 1; and
a divalent organic group represented by the following general formula (5)

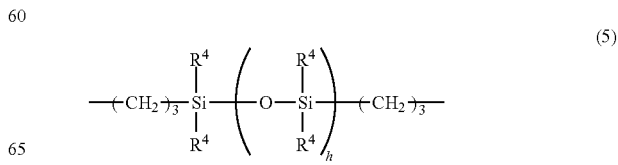

wherein R⁴'s are each independently a monovalent hydrocarbon group having 1 to 8 carbon atoms and h is an integer of 1 to 80.

10. The photo-curable resin composition according to any one of items 4 to 9, wherein the polyimidesilicone has a phenol group, a thiol group or a carboxyl group at a terminal end thereof.

11. The photo-curable resin composition according to any one of items 1 and 4 to 10, which further comprises a multifunctional epoxy compound as a component (D).

12. The photo-curable resin composition according to item 11, which comprises 100 parts by mass of the component (A), from 0.5 part by mass to 50 parts by mass of the component (B), from 0.05 part by mass to 20 parts by mass of the component (C) and from 0.05 part by mass to 100 parts by mass of the component (D).

13. The photo-curable resin composition according to item 11 or 12, which further comprises from 50 parts by mass to 2,000 parts by mass of an organic solvent as a component (E), based on 100 parts by mass in total amount of the components (A) to (D).

14. The photo-curable resin composition according to any one of items 11 to 13, wherein the component (D) is at least one multifunctional epoxy compound selected from the group consisting of a multifunctional epoxy compound having bisphenol structure, a phenol novolak multifunctional epoxy compound and a multifunctional epoxy silicone.

15. A method for forming a pattern, which comprises (i) forming a film of the photo-curable resin composition according to any one of items 1 to 14 on a substrate, (ii) exposing said film to a light having a wavelength of from 240 nm to 500 nm via a photomask, and (iii) carrying out development using a developing solution.

16. The method according to item 15, which further comprises carrying out a heating treatment after the exposure step (ii) but before the developing step (iii).

17. A protective coat film, which is obtained by carrying out post-curing of the film of photo-curable resin composition having a pattern formed by the method according to item 15 or 16, at a temperature within a range of from 70° C. to 300° C.

18. A film-shaped adhesive, which is prepared by forming the photo-curable resin composition according to any one of items 11 to 14 into a film shape.

19. An adhesive sheet, which comprises:
(I) a base material film layer,
(II) a photo-curable resin layer prepared by forming the photo-curable resin composition according to any one of items 11 to 14 into a film shape having a film thickness of from 0.1 μm to 200 μm, and
(III) a cover film layer.

By the use of the photo-curable resin composition of the invention which comprises a polyimidesilicone having a primary alcohol group, there can be provided a photo-curable resin composition which can be exposed with a light of broad wavelength, can easily form a thin film without undergoing oxygen hindrance and also can form a thick film of exceeding 20 μm. In addition, it is possible to form a pattern which is excellent in resolution, and further, since a cured film obtained from this composition is excellent in adhesiveness with a substrate, heat resistance and electrical insulation performance, it can be suitably used as a protecting film of electric and electronic parts, semiconductor devices and the like.

Further, according to the invention, there can be provided a composition which can form a minute pattern, can strongly and accurately attach substrates such as silicon, glass and the like thereafter via this pattern layer by carrying out their thermo compression bonding and post-curing and also has various reliabilities; and a dry film thereof. In addition, regarding the development at the time of pattern formation, it is possible to carry out the development with an alkaline aqueous solution having fewer environmental loads and it also becomes possible to set the heat curing temperature to 220° C. or lower.

BEST MODE FOR CARRYING OUT THE INVENTION

Figure 1:
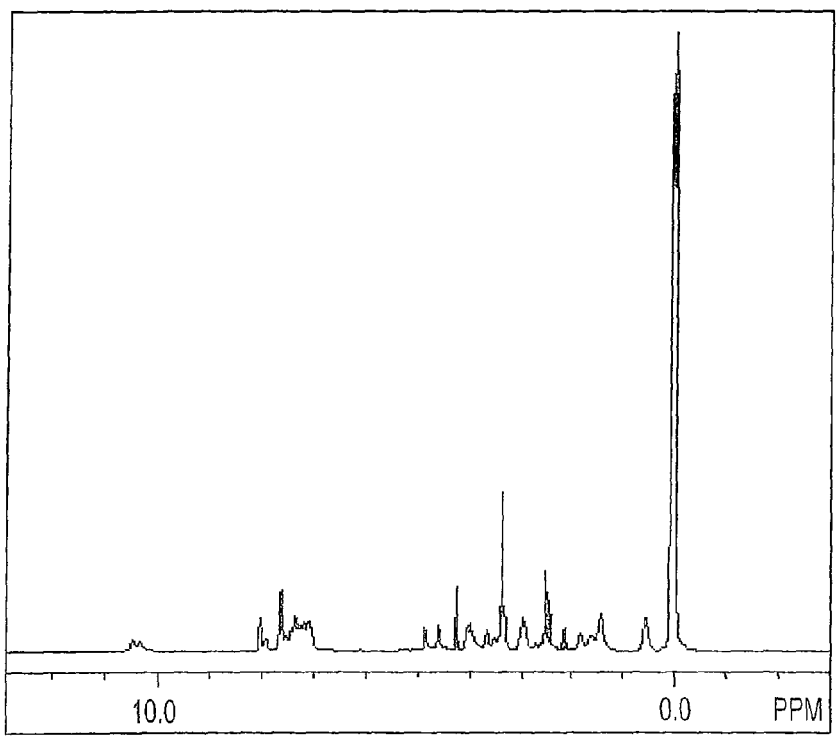
FIG. 1 is a ¹H-NMR chart of the polyimide silicone of Synthesis Example 1.

The following describes the invention further in detail.
Component (A)
The polyimidesilicone as the component (A) of the invention contains a primary alcoholic hydroxyl group.
The polyimidesilicone is preferably one represented by the following general formula (1).

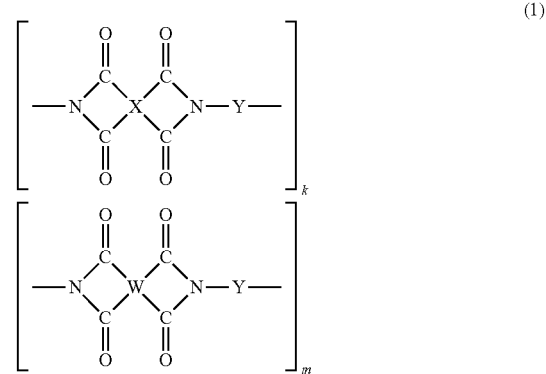

In the general formula (1), X has a structure represented by the following formula (2). By incorporating this unit, the main chain structure of the polymer is made flexible, whereby flexibility is imparted to the resin itself.

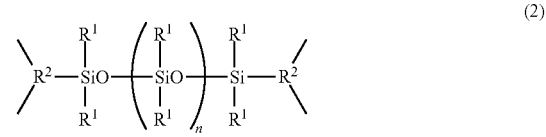

In the formula (2), R¹'s are each independently a monovalent hydrocarbon group having 1 to 8 carbon atoms, and examples thereof include alkyl groups such as a methyl group, an ethyl group, a propyl group, a butyl group, a pentyl group, and a hexyl group; cycloalkyl groups such as a cyclopentyl group and a cyclohexyl group; aryl groups such as a phenyl group; aralkyl groups such as a benzyl group and a phenethyl group; and alkenyl groups such as a vinyl group, an allyl group, a propenyl group, an isopropenyl group, and a butenyl group. From the viewpoint of easy availability of raw materials, a methyl group, an ethyl group, a phenyl group, and a vinyl group are preferred.

In the formula (2), $R^2$'s are each independently a trivalent organic group, preferably a trivalent organic group having a carbon number of 2 to 10. Examples thereof include residual groups which may be formed by removing a carboxyl group or a carboxyl anhydride group from allylsuccinic anhydrides such as propylsuccinic anhydride; norbornenedicarboxylic acid anhydride; propylnadic anhydride; and phthalic anhydride. Preferred are residual groups from norbornylic anhydride and propylsuccinic anhydride. Moreover, in the formula (2), n is an integer of 1 to 120, preferably 3 to 80, and further preferably 5 to 50.

As X, the following structures may be mentioned.

In the above structures, $n_1$ and $n_2$ are each an integer of 0 or 1 or more and satisfy a relation of $n_1+n_2=n$.

Moreover, $n_3$ and $n_4$ are each an integer of 0 or 1 or more and satisfy a relation of $n_3+n_4=n$.

Furthermore, $n_5$ and $n_6$ are each an integer of 0 or 1 or more and satisfy a relation of $n_5+n_6=n$.

As X, more specifically, the following structures may be mentioned.

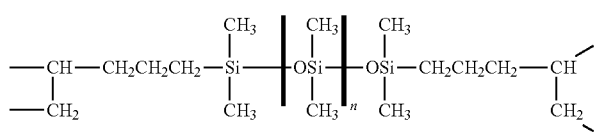

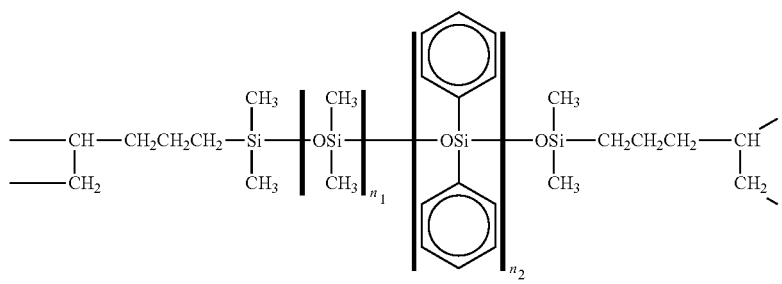

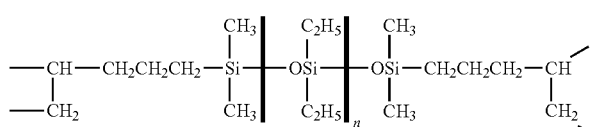

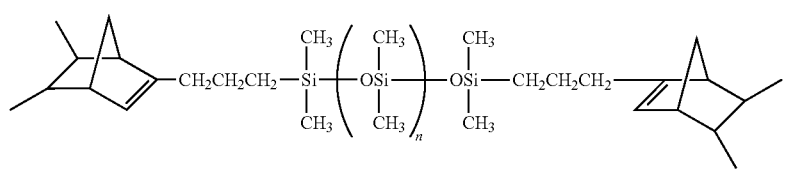

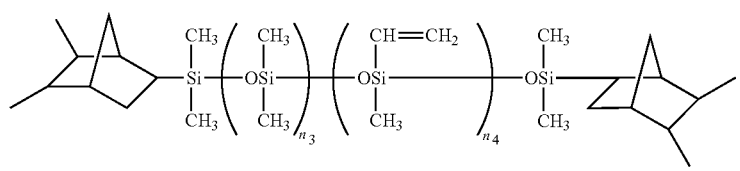

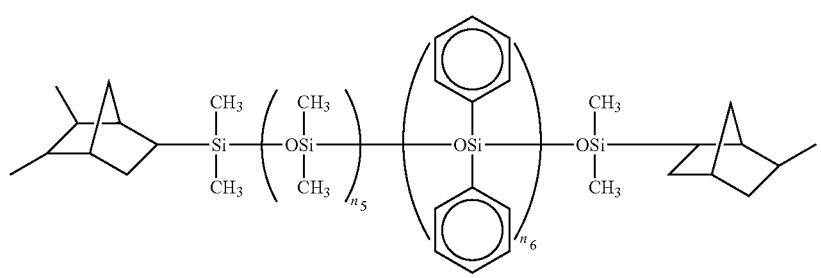

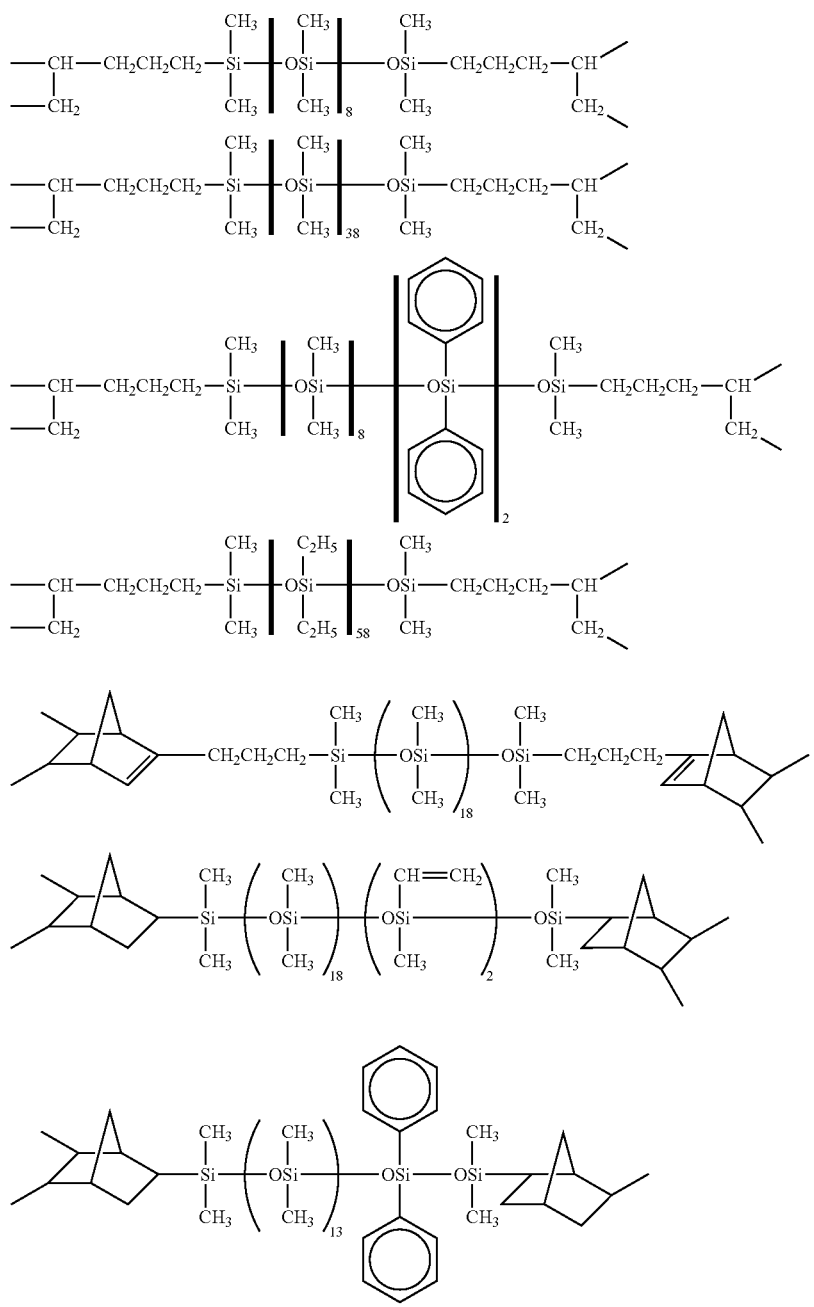

The above-mentioned X can be derived from a modified silicone obtained by reacting the above-mentioned acid anhydride having an unsaturated group such as succinic anhydride, norbornanedicarboxylic acid anhydride, propylnadic anhydride, or phthalic anhydride with an organohydrogen polysiloxane. Depending on the distribution of the number of siloxane units in the organohydrogen polysiloxane, the number of siloxane units of the resulting acid anhydride-modified polysiloxane is also distributed. Therefore, n in the formula (2) represents an average value thereof.

Y's in the general formula (1) are each a divalent organic group and at least a part thereof is a divalent organic group having a primary alcoholic hydroxyl group represented by the general formula (3).

(3)

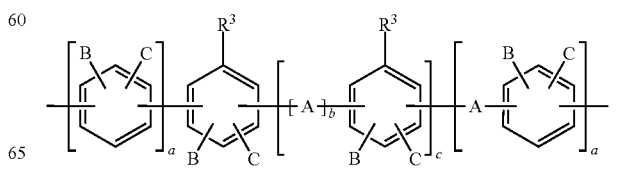

In the formula (3), A('s) is/are each independently selected from the following divalent organic groups:

—CH$_2$—, —O—, —SO$_2$—, —CONH—,

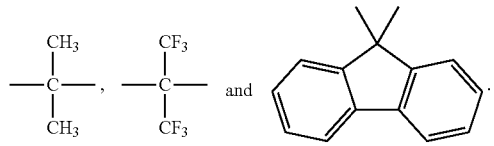

In the formula (3), a is 0 or 1, b is 0 or 1, and c is an integer of 0 to 10 and c is preferably an integer of 1 to 10.

In the formula (3), B('s) and C('s) are each an alkyl group having 1 to 4 carbon atoms or a hydrogen atom and may be the same or different from each other.

Examples thereof include a methyl group, an ethyl group, a propyl group a butyl group and a hydrogen atom. Of these, a methyl group and a hydrogen atom are preferred from the viewpoint of easy availability of raw materials.

In the above formula (3), R$^3$('s) is/are each a monovalent group selected from an organic group containing a phenolic hydroxyl group or an alcoholic hydroxyl group and at least one of R$^3$'s is an organic group containing a primary alcoholic hydroxyl group. Specifically, there may be mentioned —OH, —OCH$_2$CH(OH)CH$_2$OH, and —OCH(CH$_2$OH)CH$_2$OH.

As the group represented by the formula (3), the following groups may be mentioned.

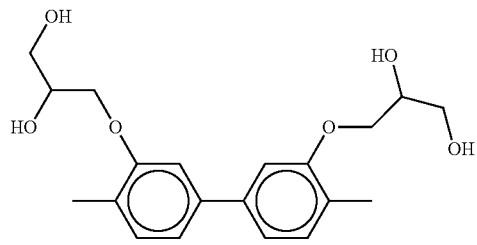

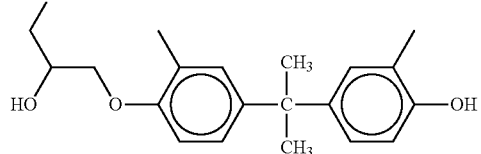

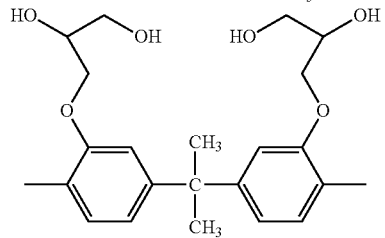

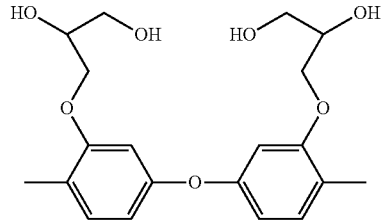

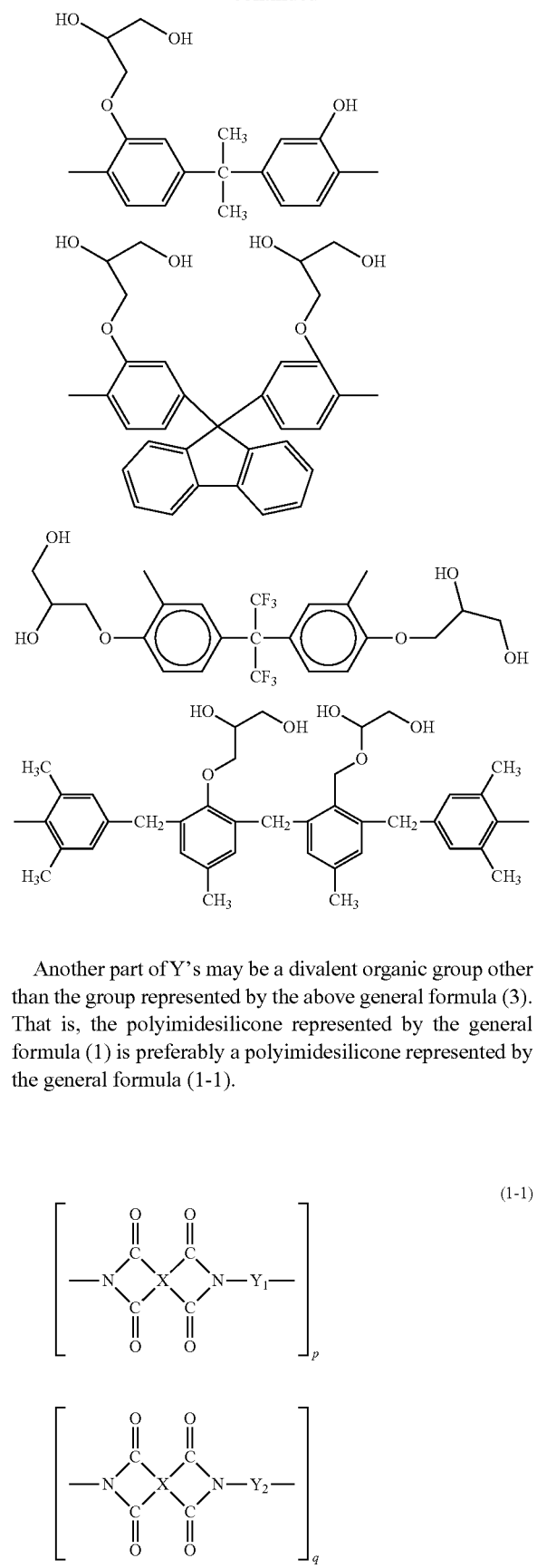

Another part of Y's may be a divalent organic group other than the group represented by the above general formula (3). That is, the polyimidesilicone represented by the general formula (1) is preferably a polyimidesilicone represented by the general formula (1-1).

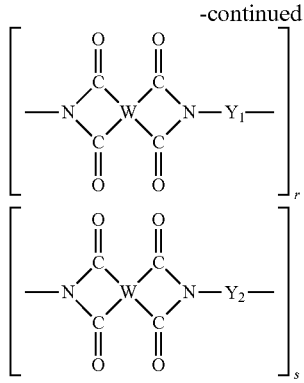

In the formula (1-1), X and W are the same as above.

$Y_1$'s are each a divalent organic group represented by the above general formula (3) and $Y_2$'s are each a divalent organic group other than the group represented by the above general formula (3).

p and r are each a positive integer, and q and s are each 0 or a positive integer, in which p, q, r and s satisfy relations of p+q=k and r+s=m (k and m are the same as above).

$Y_2$'s are each a divalent organic group other than the group represented by the above general formula (3), i.e., a divalent organic group having no primary alcoholic hydroxyl group. Specifically, it is preferably at least one selected from a divalent organic group represented by the following formula (4) and a divalent organic group represented by the following general formula (5).

The formula (4) is as follows.

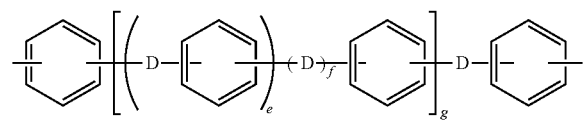

(4)

In the above formula, D('s) is/are each independently a divalent organic group which is the same as A defined above. In addition, e and f are each independently 0 or 1 and g is 0 or 1.

As the formula (4), the following groups may be mentioned.

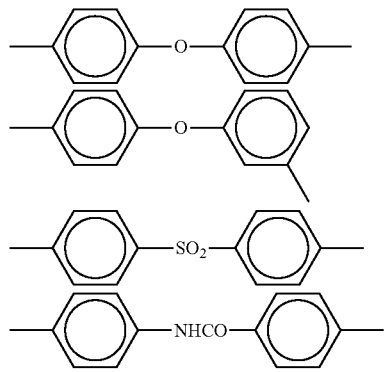

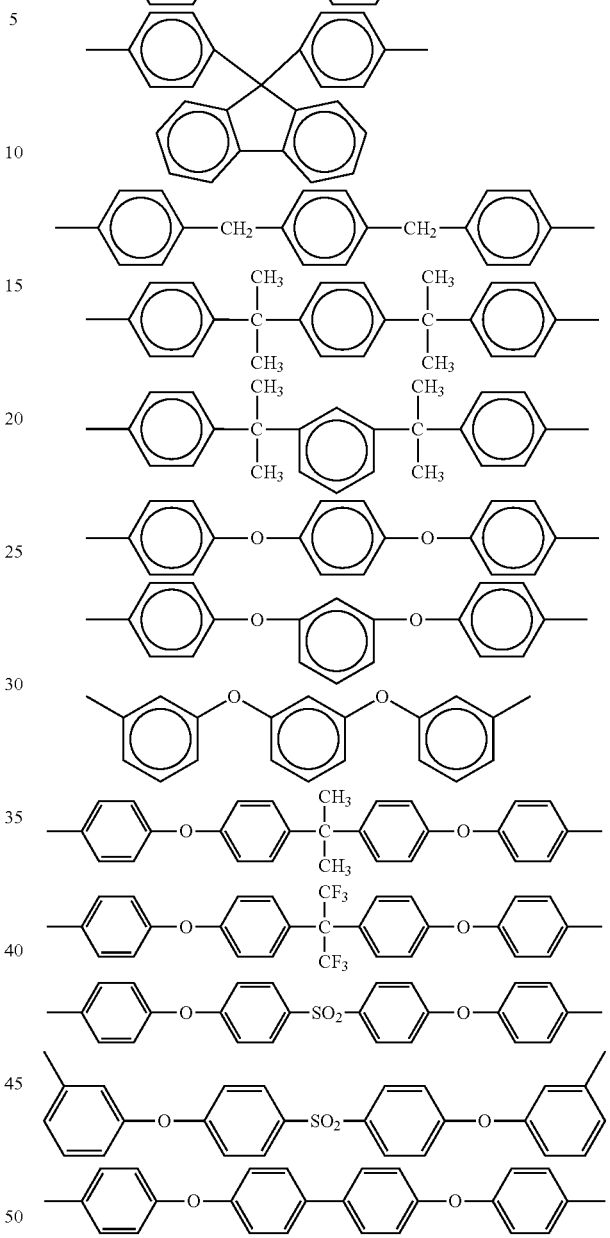

The formula (5) is as follows.

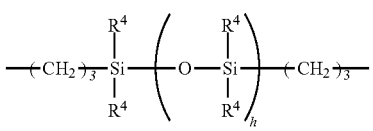

(5)

In the formula (5), $R^4$'s are each independently a monovalent hydrocarbon group having 1 to 8 carbon atoms, and examples thereof include a methyl group, an ethyl group, a propyl group, a butyl group, a hexyl group, a cyclohexyl group, and a phenyl group. Of these, from the viewpoint of availability of raw materials, a methyl group and a phenyl group are particularly preferred.

In the formula (5), h is an integer of 1 to 80, preferably an integer of 1 to 20.

In the formula (1), W may be any of known various groups as long as it is a tetravalent organic group other than the above-mentioned X and there may be exemplified the following groups.

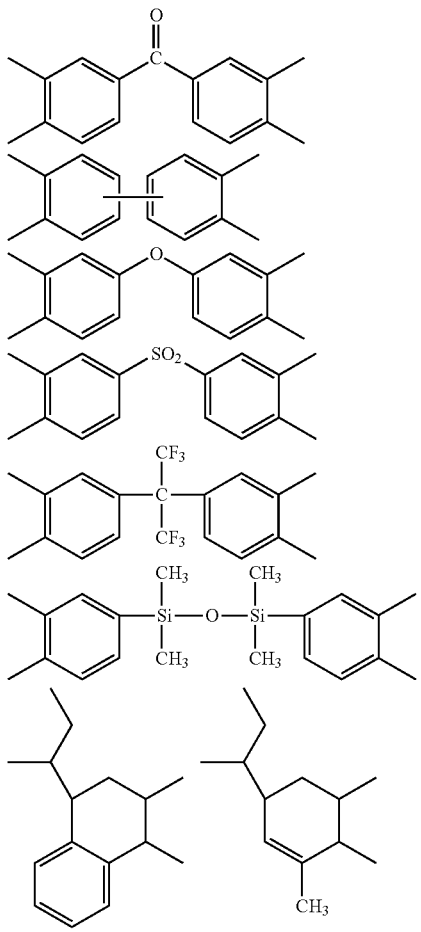

The polyimidesilicone having the above each structure as the component (A) has a molecular weight of preferably 5,000 to 200,000, particularly preferably 8,000 to 100,000, in terms of number average molecular weight. When the molecular weight thereof is smaller than 5,000, strength of the film obtained from the polyimidesilicone resin sometimes becomes low. On the other hand, when the molecular weight thereof is larger than 200,000, the polyimidesilicone resin has a poor compatibility to a solvent and handling ability decreases in some cases.

Furthermore, the number k of repeating units containing X is a positive integer and is preferably 1 to 500, more preferably 3 to 300. The number m of repeating units containing W is a positive integer and is preferably 1 to 500, more preferably 3 to 300.

Moreover, the ratio of k, i.e., k/(k+m) satisfies a relation of 0.01≤k/(k+m)<1. Preferably, the ratio is 0.1 or more and less than 1, more preferably 0.2 or more and 0.95 or less, and particularly preferably 0.5 or more and 0.9 or less. When the ratio is less than 0.01, it is difficult to attain a sufficient flexibility.

The polyimidesilicone as the component (A) preferably has an OH value in accordance with JIS K0070 of 20 to 200 KOH mg/g, particularly 30 to 150 KOH mg/g.

In order to produce the polyimidesilicone as the component (A), a diamine having a phenolic hydroxyl group, an acid anhydride-modified silicone, an acid dianhydride, and, if necessary, a diamine having no phenolic hydroxyl group and no carboxyl group are first reacted to obtain a polyamic acid.

Examples of the diamine having a phenolic hydroxyl group include diamines having a phenol group, such as 3,3'-diamino-4,4'-dihydroxybiphenyl, 2,2'-diamino-4,4'-dihydroxybiphenyl, 2,2-bis(4-amino-3-hydroxyphenyl)propane, 2,2-bis(3-amino-4-hydroxyphenyl)propane, 9,9-bis(3-amino-4-hydroxyphenyl)fluorene, 2,2'-methylenebis[6-(4-amino-3,5-dimethylbenzyl)-4-methyl]phenol, 3,3'-diamino-4,4'-dihydroxydiphenyl ether, and 2,2-bis(3-amino-4-hydroxyphenyl)hexafluoropropane.

As the acid anhydride-modified silicone, for example, the following compounds are mentioned.

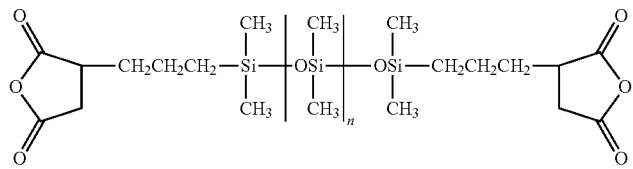

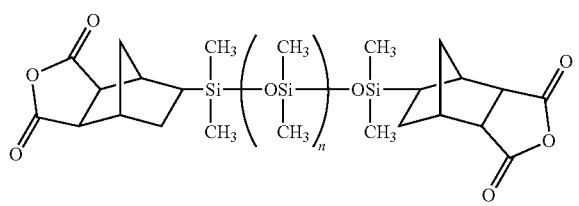

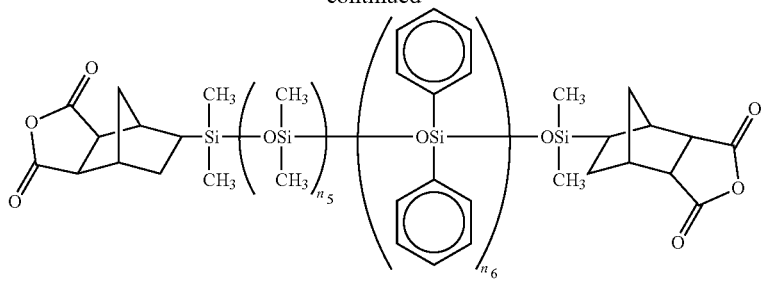

In the above-formulae, n is an integer of 1 to 120, preferably an integer of 3 to 80, and further preferably an integer of 5 to 50. In addition, $n_5$ and $n_6$ are each integer of 0 or 1 or more and satisfies a relation of $n_5+n_6=n$.

Examples of the acid dianhydride for use in the polymerization for the polyamic acid include 3,3',4,4'-diphenylsulfonetetracarboxylic dianhydride, 3,3',4,4'-biphenyhetracarboxylic dianhydride, 2,3',3,4'-biphenyltetracarboxylic dianhydride, 5-(2,5-dioxotetrahydro-3-furanyl)-3-methyl-3-cyclohexene-1,2-dicarboxylic anhydride, 4-(2,5-dioxotetrahydro furan-3-yl)-1,2,3,4-tetrahydronaphthalene-1,2-dicarboxylic anhydride, 1,2,3,4-butanetetracarboxylic dianhydride, 3,3',4,4'-benzophenonetetracarboxylic dianhydride, 4,4'-hexafluoropropylidenebisphthalic dianhydride, 2,2-bis(p-trimethoxyphenyl)propane, 1,3-tetramethyldisiloxanebisphthalic dianhydride, and 4,4'-oxydiphthalic dianhydride.

Examples of the diamine having no phenolic hydroxyl group and no carboxyl group include 4,4'-diaminobenzanilide, 4,4'-diaminodiphenyl ether, 3,4'-diaminodiphenyl ether, 4,4'-diaminodiphenyl sulfone, 3,3'-dimethyl-4,4'-diaminobiphenyl, 4,4'-(p-phenylenediisopropylidene)dianiline, 4,4'-(m-phenylenediisopropylidene)dianiline, 1,3-bis(4-aminophenoxy)benzene, 1,4-bis(4-aminophenoxy)benzene, 1,3-bis(3-aminophenoxy)benzene, 2,2-bis[4-(4-aminophenoxy)phenyl]propane, 2,2-bis[4-(4-aminophenoxy)phenyl]hexafluoropropane, bis[4-(4-aminophenoxy)phenyl]sulfone, bis[4-(3-aminophenoxy)phenyl]sulfone, 4,4'-bis(4-aminophenoxy)biphenyl, and 9,9-bis(4-aminophenyl)fluorene.

In the synthesis of the polyamic acid, the ratio of the diamine component to the acid dianhydride component is appropriately determined depending on the adjustment of the molecular weight of the polyimide and the like and is usually in the range of 0.95 to 1.05, preferably 0.98 to 1.02 as a molar ratio. In this regard, in order to introduce a reactive functional group at the polyimidesilicone terminal end, an amino alcohol, an amino thiol, a functional acid anhydride such as trimellitic acid anhydride, and an amine compound can be added. The amount thereof to be added in this case is preferably 20% by mol or less based on the acid dianhydride component or the diamine component.

The reaction of the diamine with the acid dianhydride is usually carried out in a solvent. Such a solvent may be one which dissolves polyimide. Specific examples of the solvent include ethers such as tetrahydrofuran and anisole; ketones such as cyclohexanone, 2-butanone, methyl isobutyl ketone, 2-heptanone, 2-octanone, and acetophenone; esters such as butyl acetate, methyl benzoate, and γ-butyrolactone; cellosolves such as butyl cellosolve acetate and propylene glycol monomethyl ether acetate; amides such as N,N-dimethylformamide, N,N-dimethylacetamide, and N-methyl-2-pyrrolidone; and aromatic hydrocarbons such as toluene and xylene. The solvent is preferably a ketone, an ester, and a cellosolve, particularly preferably γ-butyrolactone, propylene glycol monomethyl ether acetate, N,N-dimethylacetamide, or N-methyl-2-pyrrolidone. One kind of these solvents may be used alone or two or more kinds thereof may be used in combination. Usually, in consideration of a yield per 1 batch, dissolution viscosity, and the like, the amount is adjusted so that concentration of the polyimide becomes 10 to 40% by weight.

Then, the above obtained polyamic acid is subjected to a dehydrative ring-closure reaction to obtain a polyimide having a phenolic hydroxyl group represented by the general formula (6), and the polyimide is subsequently subjected to a reaction with glycidol, and further, if necessary, to a reaction with an acid anhydride, whereby the polyimidesilicone of the invention can be obtained.

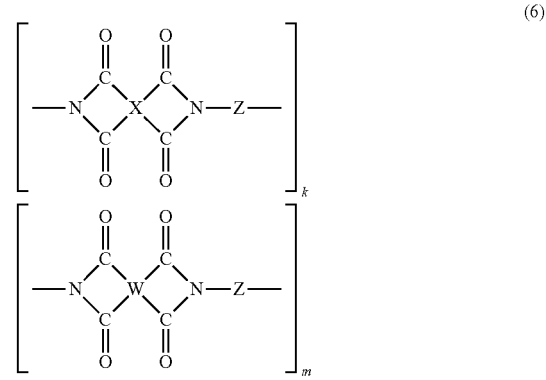

(6)

In the formula (6), X, W, k, and m are the same as above.

In addition, Z's are each a divalent organic group and at least a part thereof is a divalent organic group represented by the general formula (7).

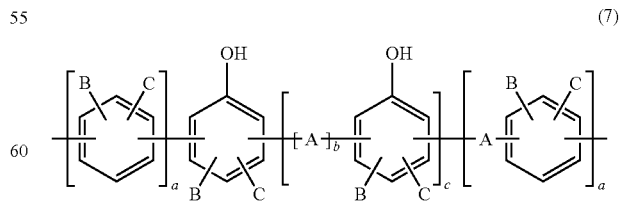

(7)

In the formula (7), A('s), B('s), C('s), a, b, and c are the same as above.

That is, for synthesis of the polyimide, the polyamic acid solution obtained in the above is heated to the temperature range of usually 80 to 200° C., preferably 140 to 180° C. or an acetic anhydride/pyridine mixed solution is added to the polyamic acid solution and the resulting solution is heated to about 50° C. to thereby allow the dehydrative ring-closure reaction to proceed at the acid amide part of the polyamic acid, whereby a polyimide can be obtained.

Glycidol is added in a necessary equivalent amount to the thus obtained organic solvent solution of the polyimide having a phenolic hydroxyl group in the molecule, which is represented by the above general formula (6), and the whole is heated. Accordingly, a polyimidesilicone having an alcoholic hydroxyl group represented by the above general formula (1) can be obtained. Although it is necessary to change the amount of glycidol to be charged depending on the amount of the alcoholic hydroxyl group to be introduced, usually, the amount thereof to be charged is preferably 0.3 to 3 molar equivalents to the phenolic hydroxyl group. The reaction temperature is 40° C. to 180° C., preferably 60 to 130° C. The reaction time is several minutes to 12 hours. Moreover, for the purpose of accelerating the reaction, a catalyst such as triethylamine may be added.

Furthermore, as the acid anhydride to be optionally reacted after the glycidol reaction, there may be mentioned phthalic anhydride, norbornenedicarboxylic acid anhydride, cyclohexyldicarboxylic acid anhydride, methylcyclohexyldicarboxylic acid anhydride, succinic anhydride, and the like.

With regard to the reaction of the acid anhydride, by adding the acid anhydride in the necessary equivalent amount and heating the whole, an objective polyimidesilicone having a carboxyl group and also having an alcoholic hydroxyl group can be obtained.

During this reaction, the reaction temperature is 10 to 120° C., preferably 20 to 90° C., and the reaction period is 1 hour to 12 hours. A catalyst may be added for the purpose of accelerating the reaction.

Component (B)

The component (B) to be used in the invention is a component which facilitates pattern formation by causing a curing reaction with the above-mentioned component (A) and also further increases strength of the cured product.

Such a component (B) is at least one compound selected from the group consisting of an amino condensation product modified with formalin or a formalin-alcohol and a phenol compound having two or more in average of methylol group or alkoxymethylol group in one molecule thereof.

As the compound as the component (B), those having a weight average molecular weight of from 150 to 10,000, particularly from 200 to 3,000 are desirable. When the weight average molecular weight is less than 150, there may be a case in which sufficient photosensitive curability cannot be obtained, and when it exceeds 10,000, there may be a case of worsening heat resistance of the composition after its curing.

As the amino condensation product of the above-mentioned component (B) modified with formalin or a formalin-alcohol, for example, there may be mentioned a melamine condensation product modified with formalin or a formalin-alcohol or a urea condensation product modified with formalin or a formalin-alcohol.

The melamine condensation product modified with formalin or a formalin-alcohol can be prepared by converting a melamine monomer into the modified melamine represented by the following formula (8), for example by firstly modifying it through methylol formation with formalin in accordance with a conventionally known method, or by further modifying this through its alkoxylation with an alcohol. In this connection, as the above-mentioned alcohol, a lower alcohol such as an alcohol having from 1 to 4 carbon atoms is desirable.

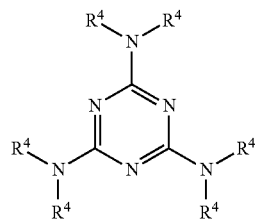

(8)

In the formula, $R^4$'s may be the same or different, and each represent a methylol group, an alkoxymethyl group containing an alkoxy group having from 1 to 4 carbon atoms or a hydrogen atom, but at least one of them is methylol group or the above-mentioned alkoxymethyl group.

As the modified melamine of the above-mentioned general formula (8), illustratively, trimethoxymethylmonomethylolmelamine, dimethoxymethylmonomethylolmelamine, trimethylolomelamine, hexamethylolmelamine, hexamethoxymethylolmelamine and the like can be mentioned.

Subsequently, the melamine condensation product of the component (B) modified with formalin or a formalin-alcohol is obtained by subjecting the modified melamine of general formula (8) or a polymer thereof (e.g., dimer, trimer or the like oligomer) to addition condensation polymerization with formamide in the usual way until it becomes the desired molecular weight. In this connection, at least one modified melamine condensation product of the monomer of general formula (8) and condensates thereof can be used as the component (B).

Also, regarding preparation of the urea condensation product modified with formalin or a formalin-alcohol, it can be prepared by modifying a urea condensation product having the desired molecular weight through methylol formation with formalin in accordance with a conventionally known method, or by further modifying this through its alkoxylation with an alcohol.

As illustrative examples of the above-mentioned modified urea condensation product, for example, there may be mentioned a methoxymethylated urea condensation product, an ethoxymethylated urea condensation product, a propoxymethylated urea condensation product and the like. In this connection, at least one of these modified urea condensation products can be used as the component (B).

In addition, as the phenol compound having two or more in average of methylol group or alkoxymethylol group in one molecule as the component (B), for example, (2-hydroxy-5-methyl)-1,3-benzenedimethanol, 2,2',6,6'-tetramethoxymethylbisphenol A and the like can be mentioned.

These amino condensation products or phenol compounds as the component (B) can be used as one species alone or by mixing two or more species.

Containing amount of the amino condensation product or phenol compound as the component (B) of the invention is preferably from 0.5 part by mass to 50 parts by mass, particularly from 1 part by mass to 30 parts by mass, based on 100 parts by mass of the polyimidesilicone as the above-mentioned component (A). When it is less than 0.5 part by mass, there may be a case in which sufficient curability cannot be obtained at the time of light irradiation, and when it exceeds 50 parts by mass on the contrary, there may be a possibility in that sufficient effect cannot be expressed due to lowering of the ratio of polyimide bonds in the photo-curable rein composition.

Component (C)

It is desirable that the photo-acid generator as the component (C) generates an acid by the irradiation of a light having a wavelength of from 240 nm to 500 nm, which becomes a curing catalyst. Since the resin composition of the invention is excellent in its compatibility with photo-acid generator, a broad range of acid generators can be used. As such a photo-acid generator, for example, there may be mentioned an onium salt, a diazomethane derivative, a glyoxime derivative, a β-ketosulfone derivative, a disulfone derivative, a nitrobenzyl sulfonate derivative, a sulfonic acid ester derivative, an imido-yl-sulfonate derivative, an oximesulfonate derivative, an iminosulfonate derivative, a triazine derivative and the like.

Among the photo-acid generators, a compound represented by the following general formula (9) can for example be mentioned as the above-mentioned onium salt.

(9)

In the formula, $R^{41}$ represents a straight, branched or cyclic alkyl group having from 1 to 12 carbon atoms which may have a substituent group, an aryl group having from 6 to 12 carbon atoms or an aralkyl group having from 7 to 12 carbon atoms, $M^+$ represents iodonium or sulfonium, represents a non-nucleophilic counter ion, and h represents 2 or 3.

As the alkyl group in the above-mentioned $R^{41}$, methyl group, ethyl group, propyl group, butyl group, cyclohexyl group, 2-oxocyclohexyl group, norbornyl group, adamantyl group and the like can for example be mentioned. Also, as the aryl group, there may be mentioned for example an alkoxyphenyl group such as o-, m- or p-methoxyphenyl, ethoxyphenyl, m- or p-tert-butoxyphenyl and the like; an alkylphenyl group such as 2-, 3- or 4-methylphenyl, ethylphenyl, 4-tert-butylphenyl, 4-butylphenyl, dimethylphenyl and the like, and the like. In addition, as the aralkyl group, benzyl, phenethyl and the like respective groups can for example be mentioned.

As the non-nucleophilic counter ion as there may be mentioned a halide ion such as chloride ion, bromide ion and the like; a fluoroalkylsulfonate such as triflate, 1,1,1-trifluoromethanesulfonate, nonafluorobutanesulfonate and the like; an arylsulfonate such as tosylate, benzenesulfonate, 4-fluorobenzenesulfonate, 1,2,3,4,5-pentafluorobenzenesulfonate and the like; an alkylsulfonate such as mesylate, butanesulfonate and the like; hexafluorophosphate ion, fluorinated alkylfluorophosphate ion and the like.

Among the photo-acid generators, a compound represented by the following general formula (10) can for example be mentioned as the diazomethane derivative.

(10)

In the formula, $R^5$'s may be the same or different, and each represent a straight, branched or cyclic alkyl group or halogenated alkyl group having from 1 to 12 carbon atoms, an aryl group or halogenated aryl group having from 6 to 12 carbon atoms, or an aralkyl group having from 7 to 12 carbon atoms.

As the alkyl group in the above-mentioned $R^5$, methyl group, ethyl group, propyl group, butyl group, amyl group, cyclopentyl group, cyclohexyl group, norbornyl group, adamantyl group and the like can for example be mentioned. As the halogenated alkyl group, trifluoromethyl, 1,1,1-trifluoroethyl, 1,1,1-trichloroethyl, nonafluorobutyl and the like can for example be mentioned.

As the aryl group, there may be mentioned for example phenyl group; an alkoxyphenyl group such as o-, m- or p-methoxyphenyl, ethoxyphenyl, m- or p-tert-butoxyphenyl and the like; an alkylphenyl group such as 2-, 3- or 4-methylphenyl, ethylphenyl, 4-tert-butylphenyl, 4-butylphenyl, dimethylphenyl and the like, and the like. As the halogenated aryl group, fluorobenzene, chlorobenzene, 1,2,3,4,5-pentafluorobenzene and the like can for example be mentioned. As the aralkyl group, benzyl group, phenethyl group and the like can for example be mentioned.

Among the photo-acid generators, a compound represented by the following general formula (11) can be mentioned as the glyoxime derivative.

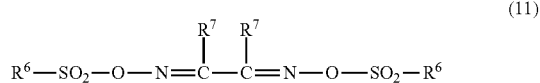

(11)

In the formula, $R^6$'s and $R^7$'s may be the same or different, and each represent a straight, branched or cyclic alkyl group or halogenated alkyl group having from 1 to 12 carbon atoms, an aryl group or halogenated aryl group having from 6 to 12 carbon atoms, or an aralkyl group having from 7 to 12 carbon atoms. In addition, the two $R^7$'s may bind together to form a cyclic structure, and when a cyclic structure is formed, $R^7$ represents a straight or branched alkylene group having from 1 to 6 carbon atoms.

As the alkyl group, halogenated alkyl group, aryl group, halogenated aryl group and aralkyl group of the above-mentioned $R^6$ and $R^7$, those which are exemplified in the above-mentioned $R^5$, and the like can be mentioned. As the alkylene group of the above-mentioned $R^7$, methylene group, ethylene group, propylene group, butylene group, hexylene group and the like can be mentioned.

As the photo-acid generator of the component (C), illustratively, there may be mentioned for example an onium salt such as diphenyliodonium trifluoromethane sulfonate, (p-tert-butoxyphenyl)phenyliodonium trifluoromethane sulfonate, diphenyliodonium p-toluenesulfonate, (p-tert-butoxyphenyl)phenyliodonium p-toluenesulfonate, triphenylsulfonium trifluoromethane sulfonate, (p-tert-butoxyphenyl) diphenylsulfonium trifluoromethane sulfonate, bis(p-tert-butoxyphenyl)phenylsulfonium trifluoromethane sulfonate, tris(p-tert-butoxyphenyl)sulfonium trifluoromethane sulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl) sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl(4-thiophenoxyphenyl)sulfonium hexafluoroantimonate and the like; a diazomethane derivative such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, 1-tert-amylsulfonyl-1-(tert-butylsulfonyl)diazomethane and the like;

a glyoxime derivative such as bis-o-(p-toluenesulfonyl-α-dimethylglyoxime, bis-o-(p-toluenesulfonyl)-α-dimethylglyoxime, bis-o-(p-toluenesulfonyl)-α-dicyclohexylglyoxime, bis-o-(p-toluenesulfonyl)-2,3-pentanedioneglyoxime, bis-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, bis-o-(camphorsulfonyl)-α-dimethylglyoxime and the like;

a β-ketosulfone derivative such as 2-cyclohexylcarbonyl-2-(p-toluenesulfonyl)propane, 2-isopropylcarbonyl-2-(p-toluenesulfonyl)propane and the like;

a disulfone derivative such as diphenyldisulfone, dicyclohexyldisulfone and the like; a nitrobenzyl sulfonate derivative such as 2,6-dinitrobenzyl p-toluenesulfonate, 2,4-dinitrobenzyl p-toluenesulfonate and the like;

a sulfonic acid ester derivative such as 1,2,3-tris(methanesulfonyloxy)benzene, 1,2,3-tris(trifluoromethanesulfonyloxy)benzene, 1,2,3-tris(p-toluenesulfonyloxy)benzene and the like;

an imido-yl-sulfonate derivative such as phthalimido-yl-triflate, phthalimido-yl-tosylate, 5-norbornane 2,3-dicarboxyimido-yl-triflate, 5-norbornane 2,3-dicarboxyimido-yl-tosylate, 5-norbornane 2,3-dicarboxyimido-yl-n-butyl sulfonate, n-trifluoro methylsulfonyloxynaphthylimide and the like;

an oxime sulfonate derivative such as α-(benzenesulfoniumoxyimino)-4-methylphenylacetonitrile and the like;

an iminosulfonate derivative such as (5-(4-methylphenyl) sulfonyloxyimino-5H-thiophene-2-ylidene)-(2-methylphenyl)acetonitrile, (5-(4-methylphenylsulfonyloxy)phenylsulfonyloxyimino)-5H-thiophene-2-ylidene)-(2-methylphenyl)acetonitrile and the like;

a triazine derivative such as 2-(methoxyphenyl)-4,6-bis(trichloromethyl)-s-triazine, 2-[2-(3,4-dimethoxyphenyl) ethenyl]-4,6-bis(trichloromethyl)-s-triazine, 2-[2-(5-methylfuran-2-yl)ethenyl]-4,6-bis(trichloromethyl)-s-triazine and the like; and the like.

Particularly among them, imido-yl sulfonates, imino sulfonates, oxime sulfonates and the like are suitably used.

The above-mentioned photo-acid generator (C) can be used alone or as a mixture of two or more species. Blending amount of the photo-acid generator (C) is preferably from 0.05 part by mass to 20 parts by mass, particularly preferably from 0.2 part by mass to 5 parts by mass, based on 100 parts by mass of the polyimidesilicone as the component (A). When the blending amount is less than 0.05 part by mass, there may be a case in which sufficient photo-curability cannot be obtained, and when it exceeds 20 parts by mass, there may be a case in which curability with a thick film worsens due to light absorption of the acid generator itself.

Component (D)

For the purpose of improving reliability of the film and its adhesiveness with the substrate by carrying out crosslinking reaction with the base polymer (namely component (A)) through the heat curing after patterning, the photo-curable resin composition of the invention may be blended with a multifunctional epoxy compound having two or more epoxy groups in one molecule thereof, as the component (D) as occasion demands.

On the other hand, when it is desirable that the photo-curable resin composition of the invention can express high substrate adhering property in attaching the substrates, the multifunctional epoxy compound having two or more epoxy groups in one molecule thereof is blended as an essential component. The multifunctional epoxy compound carries out crosslinking reaction with the base polymer, namely component (A), by the heat curing after patterning.

The multifunctional epoxy compound is preferably at least one multifunctional epoxy compound selected from the group consisting of a multifunctional epoxy compound having bisphenol structure, a phenol novolak multifunctional epoxy compound and a multifunctional epoxy silicone.

More specifically, as the multifunctional epoxy compound, preferred are a glycidyl ether form of phenol, an alicyclic epoxy compound having cyclohexene oxide group, a product in which an epoxy compound having an unsaturated bond is introduced into an organosiloxane containing hydrosilyl group by hydrosilylation reaction, and the like.

As the phenol structure of the glycidyl ether form of phenol, a novolak type, a bisphenol type, a biphenyl type, a phenolaralkyl type, dicyclopentadiene type, a naphthalene type and an amino group containing type can be employed.

Usable as the glycidyl ether form of phenol are a glycidyl ether of bisphenol type A, type AD, type S or type F, a glycidyl ether of hydrogenated bisphenol A, a glycidyl ether of ethylene oxide-added bisphenol A, a glycidyl ether of propylene oxide-added bisphenol A, a glycidyl ether of a phenol novolak resin, a glycidyl ether of a cresol novolak resin, a glycidyl ether of a naphthalene resin, a glycidyl ether of a dicyclopentadiene phenol resin, a trifunctional epoxy form of aminophenol and the like.

As the alicyclic epoxy compound having cyclohexene oxide group, CELLOXIDE 3000 and CELLOXIDE 2021P, manufactured by Daicel Chemical Industries, Ltd., can be used.

As the product in which an epoxy compound having an unsaturated bond is introduced into an organosiloxane containing hydrosilyl group by hydrosilylation reaction, there can be used various multifunctional epoxy compounds which are obtained by a method in which an epoxy compound having an unsaturated bond, such as an ally glycidyl ether, a vinylcyclohexylepoxy or the like, is allowed to react with an organosiloxane containing hydrosilyl group.

As illustrative structures, the compounds represented by the following formulae (12) to (14) can be employed.

An epoxy group-containing organosiloxane (12)

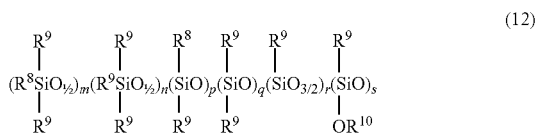

(12)

wherein, $R^8$ represents an epoxy group containing organic group, $R^9$ represents a monovalent hydrocarbon group and $R^{10}$ represents a hydrogen atom or an alkyl group, in which $(m+p)\geq 1$, $n\geq 0$, $q\geq 0$, $(r+s)\geq 0$, $0.1\leq (m+p)/(m+n+p+q)\leq 1.0$ and $0\leq (r+s)/(m+n+p+q+r+s)\leq 0.05$. Illustratively, $R^8$ is preferably glycidoxypropyl group or cyclohexylepoxyethyl group, of which most suited is glycidoxypropyl group.

An epoxy group-containing cyclic siloxane (13);

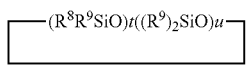 (13)

wherein $R^8$ and $R^9$ are as described in the above, in which $0.2\leq t/(t+u)\leq 1$.

A bissilyl group-substituted compound (14);

 (14)

wherein $R^8$ and $R^9$ are as described in the above; $R^{11}$ is a divalent organic group, illustratively including a straight chain alkylene group such as ethylene, propylene, hexylene and the like groups, a double substituted cyclic saturated hydrocarbon radical such as double substituted cyclopentylene group, cyclohexylene group and the like, a divalent aromatic group such as phenylene group, biphenylene group and the like, and a structure in which two or more of these are connected; and each of v and w is an integer of from 1 to 3.

As the compounds represented by the formulae (12) to (14), illustratively, the compounds of the following structures are particularly suitable. In this case, it is desirable that x is an integer of from 1 to 10, y is an integer of from 1 to 5 and z is an integer of from 1 to 10.

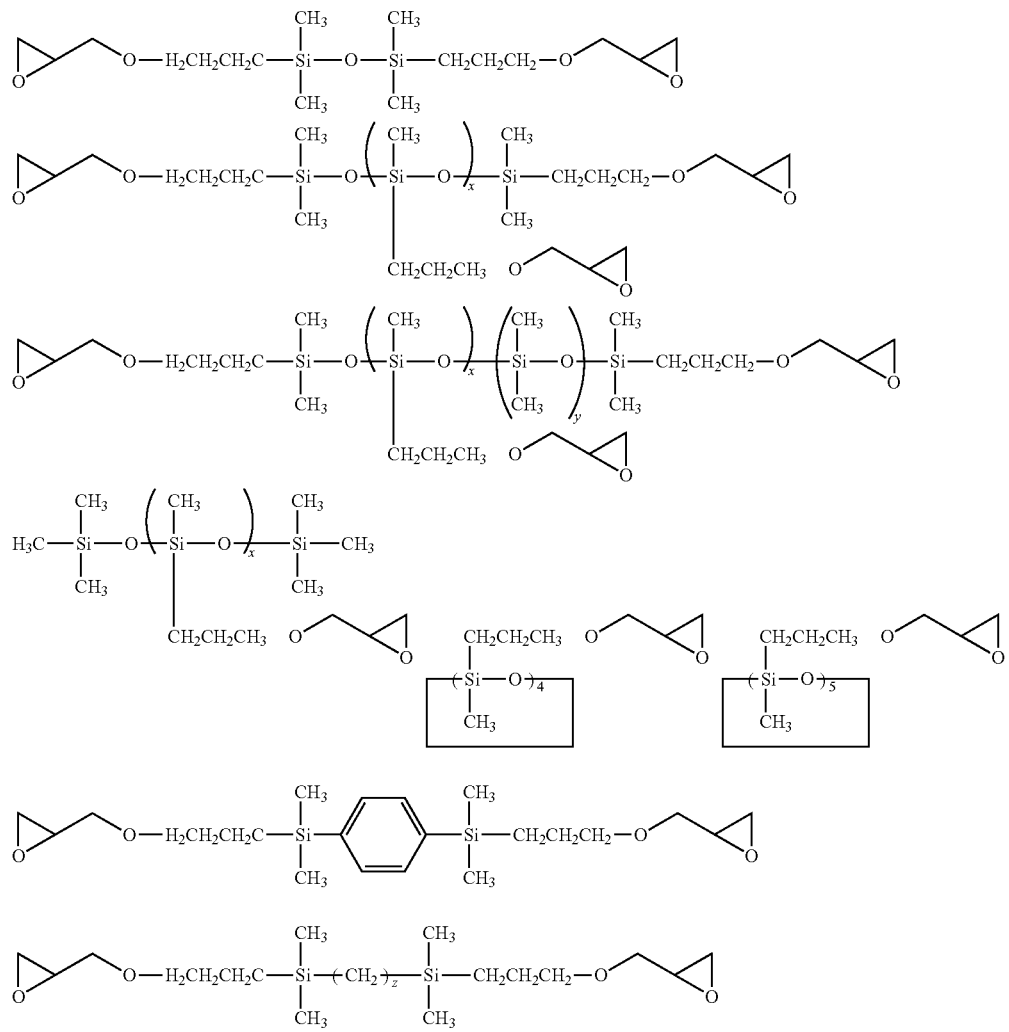

The above-mentioned multifunctional epoxy compounds as the component (D) can be used alone or as a mixture of two or more species. Blending amount of the component (D) is preferably from 0.05 part by mass to 100 parts by mass, more preferably from 0.1 part by mass to 50 parts by mass, further preferably from 1 part by mass to 30 parts by mass, based on 100 parts by mass of the polyimidesilicone as the component (A). When the blending amount is less than 0.05 part by mass, there may be a case in which adhesiveness to the substrate becomes insufficient, and when it exceeds 100 parts by mass, there may be a case in which the film is apt to become brittle because its toughness is lost, so that both cases are not suitable.

Component (E)

According to the necessity, the photo-curable resin composition of the invention may be blended with an organic solvent as the component (E). Desirable as the organic solvent is a solvent which can dissolve the above-mentioned components such as the polyimide resin as the component (A), the amino condensation product modified with formalin or a formalin-alcohol or the phenol compound having two or more in average of methylol group or alkoxymethylol group in one molecule thereof as the component (B), the photo-acid generator as the component (C) and the multifunctional epoxy compound as the component (D).

As such an organic solvent, for example, there may be mentioned ketones such as cyclohexanone, cyclopentanone, methyl-2-n-amylketone and the like; alcohols such as 3-methoxybutanol, 3-methyl-3-methoxybutanol, 1-methoxy-2-propanol, 1-ethoxy-2-propanol and the like; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether and the like; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol-mono-tert-butyl ether acetate, γ-butyrolactone and the like; amides such as N-methyl-2-pyrrolidone, N,N-dimethylacetamide and the like; and the like, and these can be used alone or in combination of two or more thereof.

Particularly among them, ethyl lactate, cyclohexanone, cyclopentanone, γ-butyrolactone, N,N-dimethylacetamide and a mixed solvent thereof are desirable because of their most superior ability of dissolving photo-acid generators.

When the component (D) is not blended, blending amount of the above-mentioned organic solvent is preferably from 50 parts by mass to 2,000 parts by mass, particularly preferably from 100 parts by mass to 1,000 parts by mass, based on 100 parts by mass of the total amount (total solid contents) of the components (A) to (C). When the blending amount is less than 50 parts by mass, there may be a case in which compatibility of the above-mentioned components (A) to (C) becomes insufficient, and when it exceeds 2,000 parts by mass on the contrary, the compatibility is hardly changed and the viscosity becomes so low that there may be a case in which it does not suit for the application of resin.

In addition, when the component (D) is blended, blending amount of the above-mentioned organic solvent is preferably from 50 parts by mass to 2,000 parts by mass, particularly preferably from 100 parts by mass to 1,000 parts by mass, based on 100 parts by mass of the total amount (total solid contents) of the components (A) to (D). When the blending amount is less than 50 parts by mass, there may be a case in which compatibility of the above-mentioned components (A) to (D) becomes insufficient, and when it exceeds 2,000 parts by mass on the contrary, the compatibility is hardly changed and the viscosity becomes so low that there may be a case in which it does not suit for the application of resin.

Other Addition Component

In addition to the above-mentioned respective components, the photo-curable resin composition of the invention may be further blended with other addition component.

As the other addition component, for example, a surfactant generally used for improving applicability can be added. As the surfactant, a nonionic agent is desirable, and there may be mentioned a fluorine system surfactant, illustratively a perfluoroalkylpolyoxyethyleneethanol, a fluorinated alkyl ester, a perfluoroalkylamine oxide, a fluorine-containing organosiloxane system compound and the like.

As these, commercially available products can be used. For example, there may be mentioned Fluorad "FC-4430" (all mfd. by Sumitomo 3M Co., Ltd.), Surflon "S-141" and "S-145" (all mfd. by ASAHI GLASS CO., LTD.), UNIDYNE "DS-401", "DS-4031" and "DS-451" (all mfd. by DAIKIN INDUSTRIES, LTD.), Megafac "F-8151" (mfd. by Dainippon Ink and Chemicals, Inc.), "X-70-093" (all mfd. by Shin-Etsu Chemical Co., Ltd.) and the like. Preferred among them are Fluorad "FC-4430" (mfd. by Sumitomo 3M Co., Ltd.) and "X-70-093" (mfd. by Shin-Etsu Chemical Co., Ltd.).

Also, in order to improve light absorption efficiency of photo-acid generators and the like, a light absorbent can also be added as other addition component. As such a light absorbent, for example, diaryl sulfoxide, diarylsulfone, 9,10-dimethylanthracene, 9-fluorenone and the like can be mentioned. In addition, in order to adjust sensitivity, a basic compound, illustratively a tertiary amine compound such as triethanolamine or a nitrogen atom-containing compound such as benzotriazole, pyridine and the like, may be added.

Further, it is possible to add a silane coupling agent, such as epoxy system silane coupling agents KBM-403, KBM-402, KBE-403 and KBE-402 and amine system silane coupling agents KBM-903, KBM-603 and KBM-573 (all mfd. by Shin-Etsu Chemical Co., Ltd.) and the like, alone as an improver of adhesiveness. In addition, an oligomerized product prepared by carrying out hydrolysis condensation of such a hydrolysable silane with an appropriate amount of water may be added. Adding amount of these silane coupling agents is preferably from 0.1 part by mass to 10 parts by mass, more preferably from 0.2 part by mass to 5 parts by mass, based on 100 parts by mass of the component (A) (base resin).

When the photo-curable resin composition of the invention is used as a resist material and the like, other optional addition components generally used in the resist material and the like can be added. In this connection, adding amount of the above-mentioned addition components can be set to general amount within such a range that the effect of the invention is not spoiled.

Preparation of the photo-curable resin composition of the invention is carried out by a general method, and the photo-curable resin composition of the invention can be prepared by mixing, while stirring, the above-mentioned respective components and, according to the necessity, the above-mentioned organic solvent, addition components and the like, and then filtering the solid contents using a filter and the like according to the necessity.

The photo-curable resin composition of the invention prepared in this manner is suitably used, for example, in the materials of a protective coat of semiconductor device, a protective coat of wiring, a cover lay film, a solder resist and further a photo resist for fine processing use and the like.

Further, when the photo-curable resin composition further contains the component (D) in addition to the components (A) to (C), the photo-curable resin composition of the invention is suited also as an adhesive which is used in laminating semiconductor devices or substrates, as is described later in detail.

The photo-curable resin composition of the invention which further contains the aforementioned component (D) renders possible formation of a minute pattern and also renders possible its application as an adhesive for attaching substrates with each other.

The pattern forming method for forming a pattern using the above-mentioned photo-curable resin composition includes the following steps:

(i) a step of forming a film of the above-mentioned photo-curable resin composition on a substrate, (ii) a step of exposing the film to a light having a wavelength of from 240 nm to 500 nm via a photomask, when necessary, a step for heating after the exposure (so-called PEB step), and (iii) a step of carrying out development using a developing solution (e.g., an alkaline developing solution).

By the above-mentioned three steps, a minute pattern can be obtained.

According to the pattern forming method of the invention, a film of the above-mentioned photo-curable resin composition is firstly formed on a substrate. As the above-mentioned substrate, for example, there may be mentioned wafer made of silicon, glass or quarts, as well as a plastic or ceramic circuit card or a material having a resin film on the substrate surface, and the like.

As the method for forming a film, it can be carried out by employing a conventionally known lithography technique. For example, application can be carried out using a solution prepared by blending the photo-curable resin composition with an organic solvent, by a technique such as a dipping method, a spin coat method, a roll coat method and the like. The applying amount can be optionally selected in response to the purpose, but for example, it is desirable to set the film thickness to from 0.1 μm to 100 μm. Also, when a film-shaped adhesive is formed, it is desirable to set the film thickness to from 0.1 μm to 200 μm.

In addition, as the film forming method, there can also be employed a method in which this photo-curable resin composition is separately made into a film, and the film is then attached to a substrate.

In this case, in order to carry out the photo-curing reaction efficiently, the solvent and the like may be volatilized in advance by a preliminary heating according to the necessity. The preliminary heating can be carried out for example at from 40° C. to 140° C. for approximately from 1 minute to 1 hour. Next, the curing is effected by exposing to a light of from 240 nm to 500 nm in wavelength via a photomask. The above-mentioned photomask may for example be a product of hollowing out a desired pattern. In this connection, it is desirable that the material of photomask can shield the above-mentioned light of from 240 nm to 500 nm in wavelength, and for example, chrome and the like are suitably used though not limited thereto.

As the above-mentioned light of from 240 nm to 500 nm in wavelength, for example, there may be mentioned lights of various wavelengths generated by a radiation generator, such as g ray, i ray and the like ultraviolet lights, far ultraviolet light (248 nm) and the like. As the exposure value, for example, from 10 mJ/cm$^2$ to 5,000 mJ/cm$^2$ is desirable. In this case, in order to further increase development sensitivity, a heat treatment may be carried out after exposure according to the necessity. The above-mentioned post-exposure heat treatment can be carried out for example at a temperature of from 40° C. to 140° C. for a period of from 0.5 minute to 10 minutes.

After the above-mentioned exposure or post-exposure heating, development is carried out using a developing solution (e.g., an alkaline developing solution). Desirable as the developing solution is an organic solvent system used as a solvent, such as dimethyl acetamide, cyclohexanone or the like, or an alkaline aqueous solution such as an aqueous solution of tetramethylammonium hydroxide, sodium carbonate or the like. The development can be carried out by a general method such as dipping of a pattern formation product. Thereafter, a composition coat film having a desired pattern is obtained by carrying out washing, rinsing, drying and the like according to the necessity. In this connection, the pattern forming method is as described in the above, but when it is not necessary to form a pattern, for example when it is desirable to form a merely uniform coat, the same method as described in the above-mentioned pattern forming method may be carried out except that the above-mentioned photomask is not used.

In addition, the crosslink density can be increased and the residual volatile components can be removed by further heating the thus obtained pattern using an oven or hot plate at from 70° C. to 300° C., preferably from 120° C. to 300° C., for from 10 minutes to 10 hours. This renders possible formation of a coat film which is excellent in adhesiveness to the substrate and has good heat resistance, strength and also electric characteristics.

Since the cured coat film obtained from the above-mentioned photo-curable resin composition in this manner is excellent in the adhesiveness to substrate, heat resistance and electric insulation property, it can be suitably used as a protective film of electric and electronic parts, semiconductor device and the like and it also can form a minute patters, and what is more, since the formed coat film is excellent in adhesiveness to substrate, electric characteristics, mechanical characteristics and the like, it can be suitably used in a protective film for semiconductor device, protecting film for wiring, cover lay film, solder resist and the like.

Next, a process in which the photo-curable resin composition of the invention containing the components (A) to (D) is used as an adhesive is described in the following.

The process includes:

(i) step of forming a film of the above-mentioned photo-curable resin composition of the invention containing the components (A) to (D) on a substrate, (ii) step of exposing to a light having a wavelength of from 240 nm to 500 nm via a photomask, and when necessary, a step for heating after the exposure (so-called PEB step), (iii) step of carrying out development using a developing solution (e.g., an alkaline developing solution), (iv) step of carrying out thermo compression bonding with another substrate under an atmosphere of reduced pressure, and (v) heating step for post-curing.

The steps (i) to (iii) are the same as the case of the above-mentioned pattern formation. In addition, when a pattern is not formed, the exposure in the step (ii) may be carried out without using the photomask.

The thermo compression bonding temperature in the step (iv) is within the range of preferably from 40° C. to 300° C., more preferably from 50° C. to 250° C., and the pressure of compression bonding is preferably from 0.01 MPa to 100 MPa, more preferably from 0.05 MPa to 30 MPa.

Thereafter, the substrates can be strongly adhered to each other via the heating step for post-curing. The temperature of post-curing is preferably from 80° C. to 300° C., more preferably from 120° C. to 280° C.

The following describes the film-shaped adhesive and adhesive sheet of the invention.

The film-shaped adhesive is prepared by forming the photo-curable resin composition of the invention containing the components (A) to (D) into a film shape. The film-shaped adhesive can be produced for example by coating the photo-curable resin composition on the surface of a base material film and drying it according to the necessity. The film thickness is preferably from 0.1 μm to 200 μm, more preferably from 1 μm to 200 μm, particularly preferably from 1 to 100 μm.

It is desirable that the adhesive sheet has, for example, the following three layer structure:

(I) a base material film layer, (II) a photo-curable resin layer prepared by forming the photo-curable resin composition containing the components (A) to (D) into a film shape having a film thickness of from 0.1 μm to 200 μm, and (III) a cover film layer.

When it has such a three layer structure, its handling is easy and the adhesive layer can be easily formed by transferring the photo-curable resin layer on the substrate which becomes the object of adhesion. For example, as the film forming step of the step (i) in the above-mentioned pattern formation and adhering process of substrates, there can be employed a step of forming a photo-curable resin layer on a substrate by transferring the photo-curable resin layer on the substrate, by peeling off the cover film of the adhesive sheet, attaching the photo-curable resin layer with the substrate at a contacting direction and then removing the substrate film.

The adhesive sheet can be produced for example by a step of forming a photo-curable resin layer by coating the photo-curable resin composition of the invention on the surface of a substrate film and drying it according to the necessity and by the subsequent step of covering the layer with a cover film. The photo-curable resin layer is laminated in a film thickness of preferably from 0.1 μm to 200 μm, more preferably from 1 μm to 200 μm, particularly preferably from 1 μm to 100 μm.

As materials of the substrate film and cover film, polyethylene, polypropylene, PET and polycarbonate can be used, though not limited thereto.

For the formation of coat film, for example, an applicator, a bar coater, a roll coater, a curtain flow coater and the like are used.

The drying temperature is within the range of preferably from 40° C. to 180° C., further preferably from 60° C. to 130° C. The cover film can be attached to the photo-curable resin layer at room temperature, but can also be attached while heating at approximately from 40° C. to 60° C.

EXAMPLES

The following describes the invention further in detail by showing synthesis examples, examples and comparative examples, though the invention is not limited to the following examples.

Synthesis Example 1

A flask equipped with a stirrer, a thermometer and a nitrogen substitution device was charged with 31.0 g (0.15 mol) of 4,4'-oxydiphthalic acid dianhydride, 155.1 g (0.15 mol) of an acid anhydride-modified siloxane, with its average structure being represented by the following formula (15), and 600 g of N-methyl-2-pyrrolidone. Next, while adjusting temperature of the reaction system such that it does not exceed 50° C., 91.5 g (0.25 mol) of 2,2-bis(4-amino-3-hydroxyphenyl)hexafluoropropane was added to the flask. Thereafter, the contents were further stirred at room temperature for 10 hours. Subsequently, a reflux condenser equipped with a water receiver was attached to said flask, and then 100 g of xylene was added thereto, and temperature of the system was increased to 170° C. and maintained at the same level for 6 hours, thereby obtaining a brown solution.

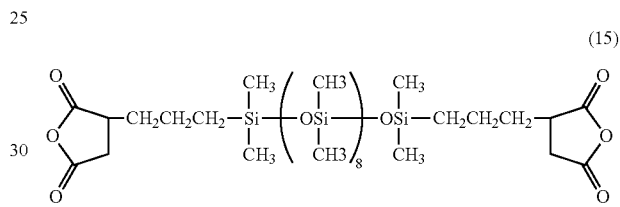

(15)

After cooling the thus obtained brown solution to room temperature (25° C.), a polyimide silicone solution having a phenolic hydroxyl group was obtained. Next, 23 g of glycidol was added to this polyimide silicone solution in the flask and heated at 120° C. for 3 hours. After completion of the reaction, and subsequent cooling to room temperature, the reaction solution was poured into methanol and then the thus precipitated precipitate was filtered and dried, thereby obtaining the intended polyimide silicone A-1 having a primary alcoholic hydroxyl group. As a result of $^1$H-NMR analysis of this polymer, the 10 ppm peak originated from the phenolic hydroxyl group was reduced and the peaks originated from the primary and secondary alcoholic hydroxyl groups were observed at 4.6 ppm and 4.8 ppm, so that it was found that this is a polymer having the repeating unit structure represented by the following formula (FIG. 1). As a result of gel permeation chromatography (GPC), number average molecular weight of this polymer was 39,000, and the OH value based on JIS K0070 was 100 KOH mg/g.

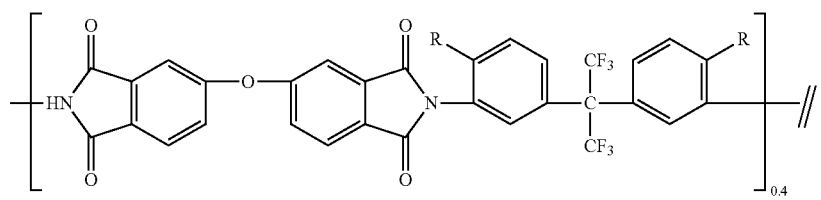

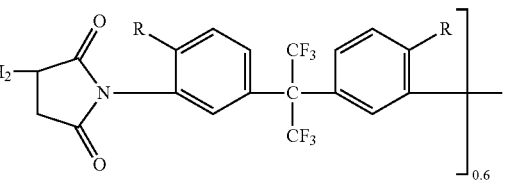

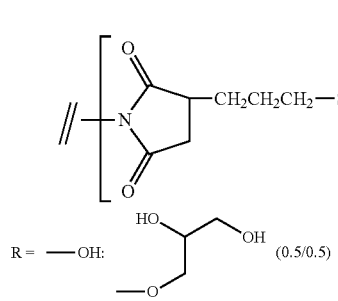

Synthesis Example 2

A flask equipped with a stirrer, a thermometer and a nitrogen substitution device was charged with 55.5 g (0.125 mol) of 4,4'-hexafluoropropylidene bisphthalic acid dianhydride, 137.0 g (0.125 mol) of an acid anhydride-modified siloxane, with its average structure being represented by the following formula (16), and 800 g of γ-butyrolactone. Next, while adjusting temperature of the reaction system such that it does not exceed 50° C., 91.5 g (0.25 mol) of 2,2-bis(4-amino-3-hydroxyphenyl)hexafluoropropane was added to the above-mentioned flask. Thereafter, the contents were further stirred at room temperature for 10 hours. Subsequently, a reflux condenser equipped with a water receiver was attached to said flask, and then 200 g of xylene was added thereto, and temperature of the system was increased to 170° C. and maintained at the same level for 6 hours, thereby obtaining a brown solution.

Figure 2:
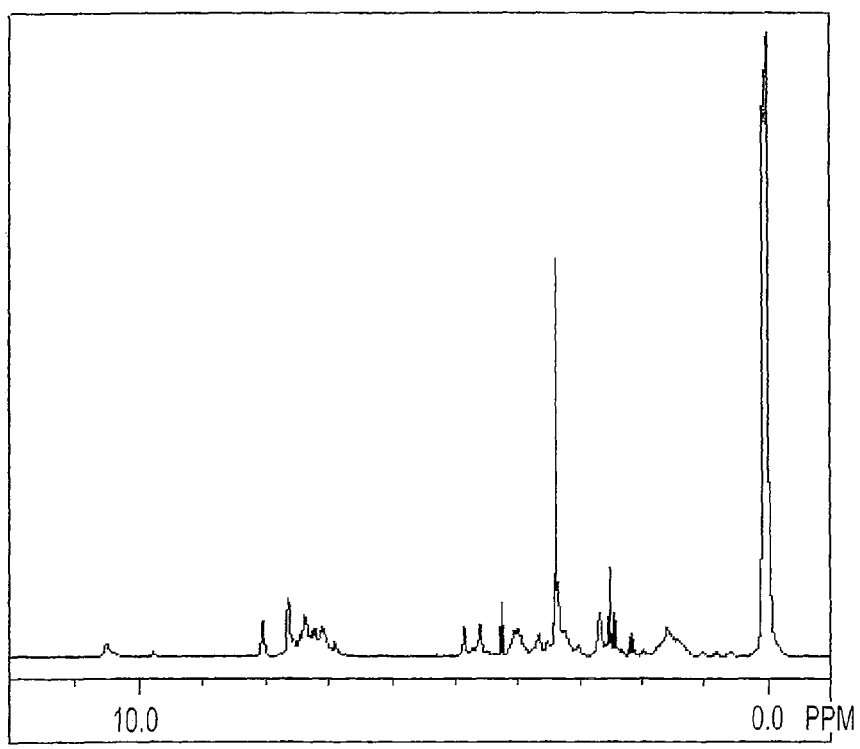
FIG. 2 is a ¹H-NMR chart of the polyimide silicone of Synthesis Example 2.

After cooling the thus obtained brown solution to room temperature (25° C.), a polyimide silicone solution having a phenolic hydroxyl group was obtained. Next, 18.3 g of glycidol was added to this polyimide silicone solution in the flask and heated at 120° C. for 3 hours. After completion of the reaction and subsequent cooling to room temperature, the reaction solution was poured into methanol and then the thus precipitated precipitate was filtered and dried, thereby obtaining the intended polyimide silicone A-2 having a primary alcoholic hydroxyl group. As a result of $^1$H-NMR analysis of this polymer, the 10 ppm peak originated from the phenolic hydroxyl group was reduced and the peaks originated from the primary and secondary alcoholic hydroxyl groups were observed at 4.6 ppm and 4.8 ppm, so that it was found that this is a polymer having the repeating unit structure represented by the following formula (FIG. 2). As a result of gel permeation chromatography (GPC), number average molecular weight of this polymer was 32,000, and the OH value based on JIS K0070 was 100 KOH mg/g.

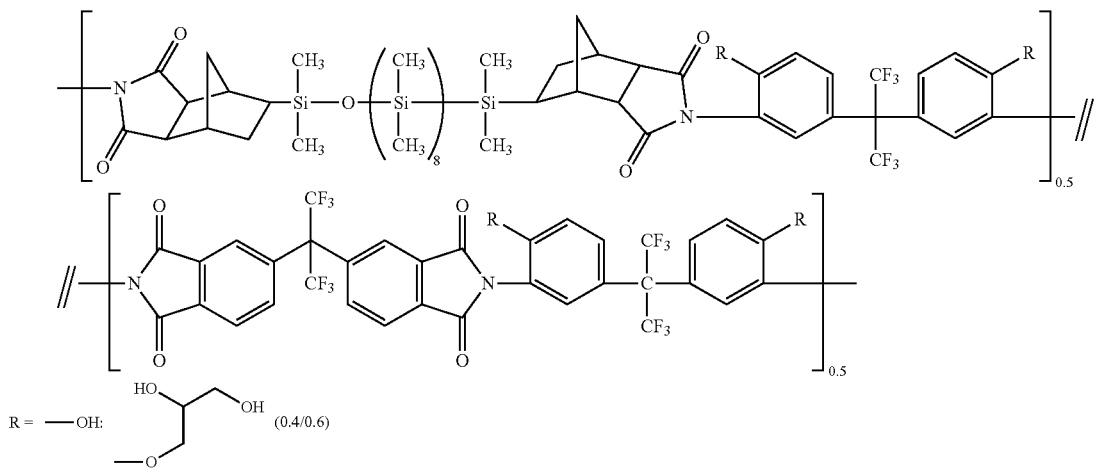

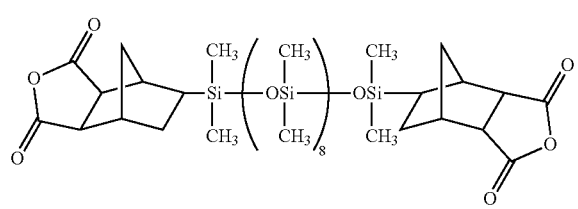

(16)

Synthesis Example 3

A flask equipped with a stirrer, a thermometer and a nitrogen substitution device was charged with 31.0 g (0.1 mol) of 4,4'-oxydiphthalic acid dianhydride, 184.2 g (0.1 mol) of an acid anhydride-modified siloxane, with its average structure being represented by the following formula (17), and 800 g of γ-butyrolactone. Next, while adjusting temperature of the reaction system such that it does not exceed 50° C., 36.6 g (0.1 mol) of 2,2-bis(4-amino-3-hydroxyphenyl)hexafluoropropane and 23.4 g (0.08 mol) of 1,4-diaminophenoxybenzene were added to the above-mentioned flask. Thereafter, 4.4 g (0.02 mol) of p-aminophenol was added thereto and further stirred at room temperature for 10 hours. Subsequently, a reflux condenser equipped with a water receiver was attached to said flask, and then 200 g of xylene was added thereto, and temperature of the system was increased to 170° C. and maintained at the same level for 6 hours, thereby obtaining a brown solution.

Figure 3:
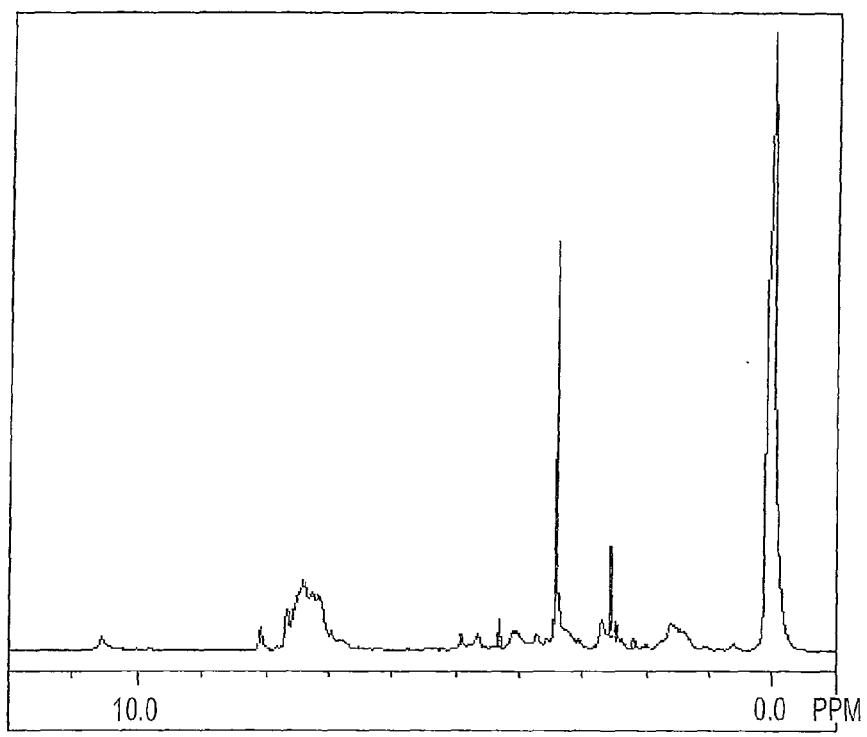
FIG. 3 is a ¹H-NMR chart of the polyimide silicone of Synthesis Example 3.

After cooling the thus obtained brown solution to room temperature (25° C.), a polyimide silicone solution having a phenolic hydroxyl group was obtained. Next, 16.5 g of glycidol was added to this polyimide silicone solution in the flask and heated at 120° C. for 3 hours. After completion of the reaction and subsequent cooling to room temperature, the reaction solution was poured into methanol and then the thus precipitated precipitate was filtered and dried, thereby obtaining the intended polyimide silicone A-3 having a primary alcoholic hydroxyl group. As a result of $^1$H-NMR analysis of this polymer, the 10 ppm peak originated from the phenolic hydroxyl group was reduced and the peaks originated from the primary and secondary alcoholic hydroxyl groups were observed at 4.6 ppm and 4.8 ppm, so that it was found that this is a polymer having the repeating unit structure represented by the following formula (FIG. 3). As a result of gel permeation chromatography (GPC), number average molecular weight of this polymer was 19,000, and the OH value based on JIS K0070 was 39 KOH mg/g.

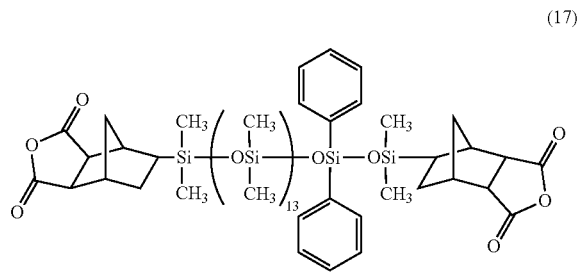

(17)

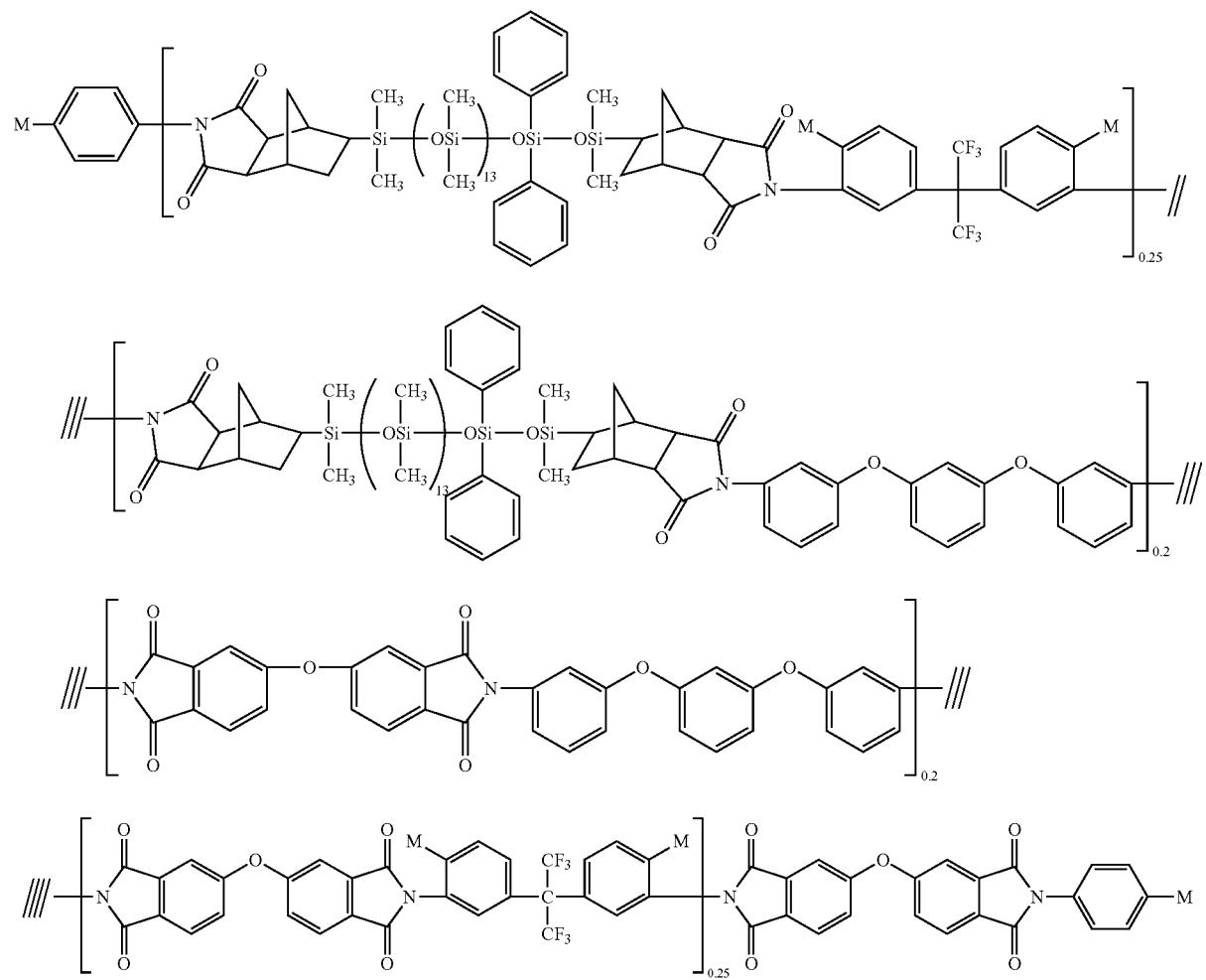

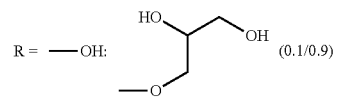

Synthesis Example 4

A flask equipped with a stirrer, a thermometer and a nitrogen substitution device was charged with 31.0 g (0.1 mol) of 4,4'-oxydiphthalic acid dianhydride, 164.4 g (0.15 mol) of an acid anhydride-modified siloxane used in Synthesis Example 2, with its average structure being represented by the formula (16), and 800 g of γ-butyrolactone. Next, while adjusting temperature of the reaction system such that it does not exceed 50° C., 45.25 g (0.175 mol) of 2,2-bis(4-amino-3-hydroxyphenyl)propane and 14.6 g (0.05 mol) of 1,4-diaminophenoxybenzene were added to the above-mentioned flask. Thereafter, 5.5 g (0.025 mol) of p-aminophenol was added thereto and further stirred at room temperature for 10 hours. Subsequently, a reflux condenser equipped with a water receiver was attached to said flask, and then 200 g of xylene was added thereto, and temperature of the system was increased to 170° C. and maintained at the same level for 6 hours, thereby obtaining a brown solution.

Figure 4:
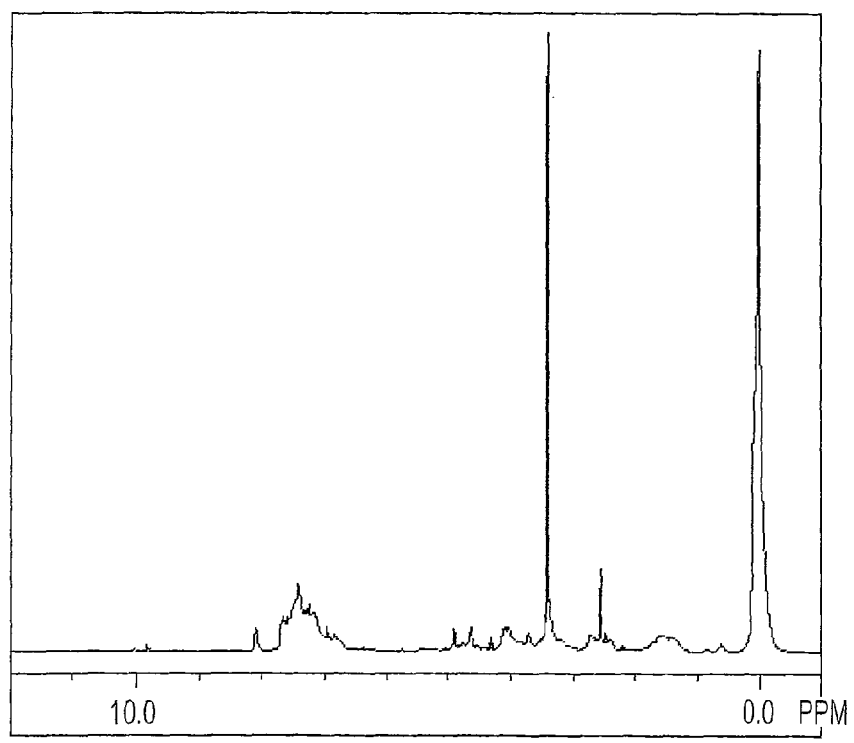
FIG. 4 is a ¹H-NMR chart of the polyimide silicone of Synthesis Example 4.

After cooling the thus obtained brown solution to room temperature (25° C.), a polyimide silicone solution having a phenolic hydroxyl group was obtained. Next, 10.9 g of glycidol was added to this polyimide silicone solution in the flask and heated at 120° C. for 3 hours. After completion of the reaction and subsequent cooling to room temperature, the reaction solution was poured into methanol and then the thus precipitated precipitate was filtered and dried, thereby obtaining the intended polyimide silicone A-4 having a primary alcoholic hydroxyl group. As a result of $^1$H-NMR analysis of this polymer, the 10 ppm peak originated from the phenolic hydroxyl group was reduced and the peaks originated from the primary and secondary alcoholic hydroxyl groups were observed at 4.6 ppm and 4.8 ppm, so that it was found that this is a polymer having the repeating unit structure represented by the following formula (FIG. 4). As a result of gel permeation chromatography (GPC), number average molecular weight of this polymer was 22,000, and the OH value based on JIS K0070 was 51 KOH mg/g.

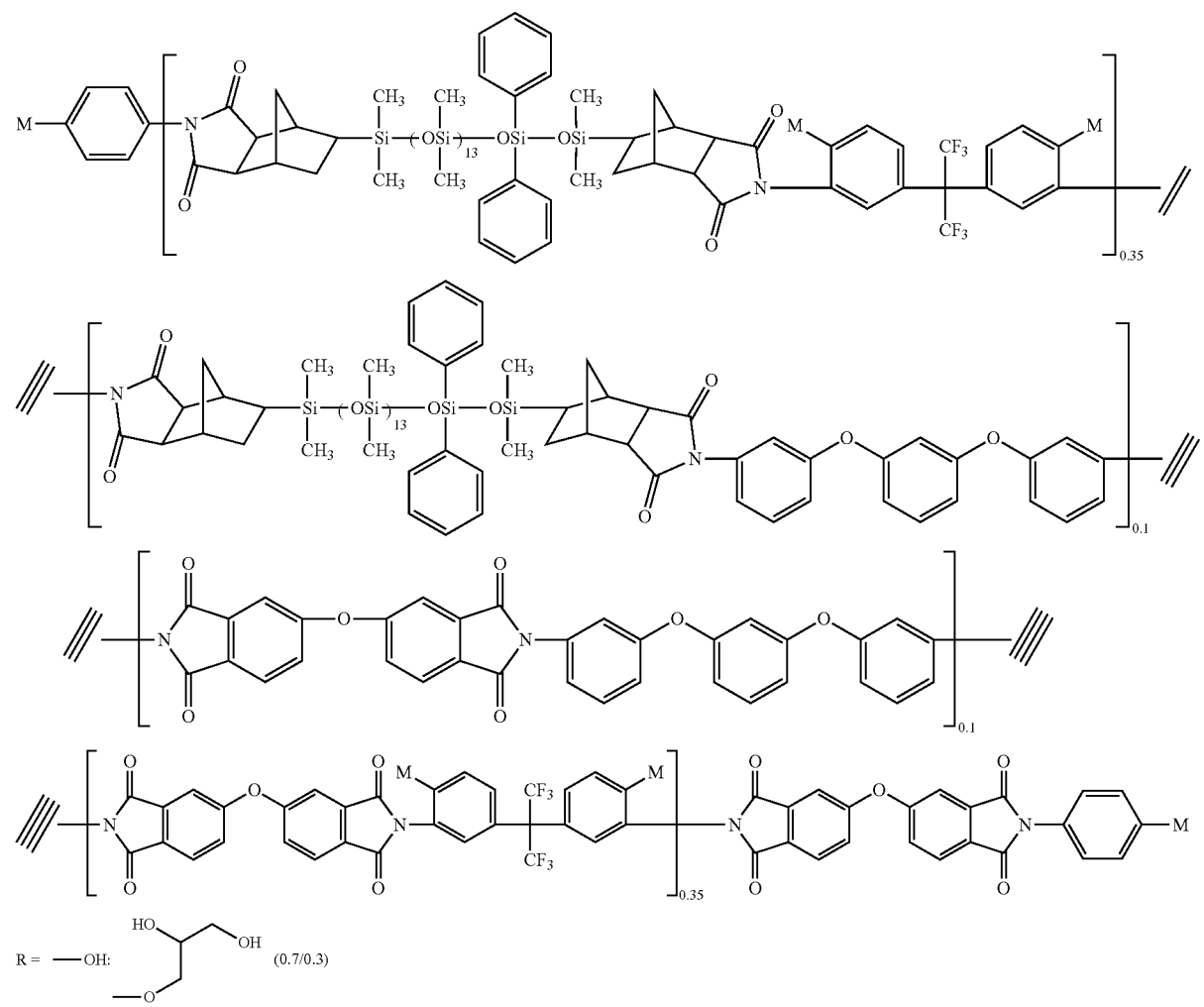

Synthesis Example 5

Comparative Example

The same operation of Synthesis Example 1 was carried out, except that glycidol was not allowed to react with the polyimide silicone solution before allowing glycidol to react therewith in Synthesis Example 1, and the polyimide silicone obtained by collecting the precipitate was named A'-1. The A'-1 is a polyimide silicone which does not have a primary alcoholic hydroxyl group.

Synthesis Example 6

Comparative Example

A flask equipped with a stirrer, a thermometer and a nitrogen substitution device was charged with 77.5 g (0.25 mol) of 4,4'-oxydiphthalic acid dianhydride and 500 g of N,N-dimethylacetamide. Next, while adjusting temperature of the reaction system such that it does not exceed 50° C., 51.6 g (0.2 mol) of 2,2-bis(4-amino-3-hydroxyphenyl)propane and 42.0 g (0.05 mol) of a diaminosiloxane (its residue is represented by the general formula (5), and average of h in said formula is 9) were added dropwise to the above-mentioned flask. After completion of the dropwise addition, the contents were further stirred at room temperature for 10 hours. Subsequently, a reflux condenser equipped with a water receiver was attached to said flask, and then 150 g of toluene was added thereto, and temperature of the system was increased to 150° C. and maintained at the same level for 6 hours, thereby obtaining a brown solution.

After cooling the thus obtained brown solution to room temperature (25° C.), a polyimide solution having a phenolic hydroxyl group (resin solid content 20.5%) was obtained. Next, 300 g of this polyimide solution and 13.3 g of glycidol were put into a flask and heated at 120° C. for 5 hours. After completion of the reaction, and subsequent cooling to room temperature, the reaction solution was poured into methanol and then the thus precipitated precipitate was filtered and dried, thereby obtaining a polyimide A'-2. As a result of gel permeation chromatography (GPC), number average molecular weight of this polymer was 63,200.

trademark). In this connection, similar test was carried out as a comparison using the A'-1 and A'-2 synthesized in Synthesis Examples 5 and 6.

The composition of each Example was coated on two sheets of 6 inch silicon wafer prime-treated with hexamethyl disilazane and one sheet of copper substrate prepared by electrolytic copper plating on entire surface of the 6 inch silicon wafer to a film thickness of 2 μm, using a spin coater to the film thickness described in the table. One sheet of silicon wafer among the three thus prepared was dried by heating at 90° C. for 2 minutes using a hot plate in order to remove the solvent, and then exposed to a light of the wavelength and exposure value described in Table 1 via a quarts mask having regular intervals and spaces of from 1 μm to 50 μm in line width. In this connection, the NSR-1755i7A represents a stepper exposure device manufactured by NIKON CORP. After the irradiation, this was heated at 90° C. for 2 minutes and then cooled.

Thereafter, development was carried out by soaking the above-mentioned wafer coated with the composition for 8 minutes in 2.38% aqueous solution of tetramethylammonium hydroxide. The line width resolved in this case was described in Table 1. In addition, the film thickness after development was also described therein.

The composition of each Example described in Table 1 was coated also on the remaining silicon wafer and copper substrate under the same conditions and pre-baking was carried out in order to remove the solvent. In addition, after applying light to the entire surface thereof at a broad band of the light source wavelength not via the quarts mask but using a mask

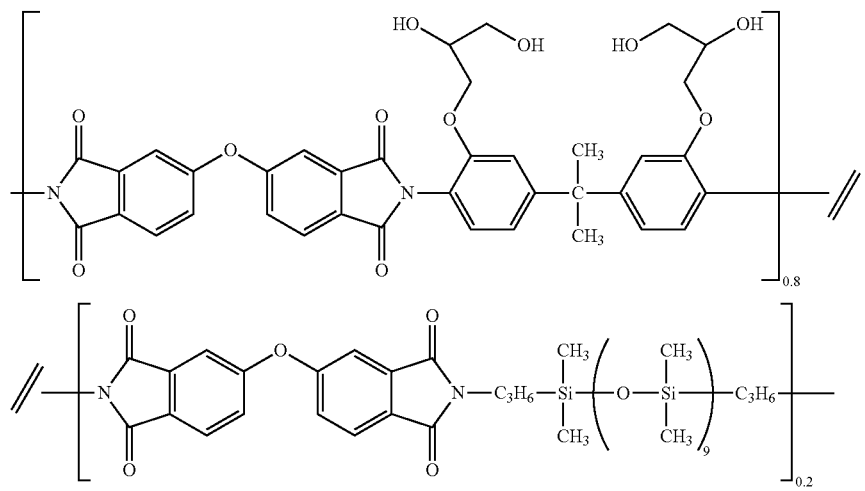

Preparation of Photo-Curable Resin Compositions

Examples 1 to 6 and Comparative Examples 1 and 2

The photo-curable resin compositions of the invention corresponding to Examples 1 to 6 were obtained by using the polyimide silicones A-1 to A-4 synthesized in Synthesis Examples 1 to 4 as the component (A), blending crosslinking agent, photo-acid generator, other additive agent, solvent and the like by the compositions described in Table 1, stirring, mixing and dissolving them and then carrying out microfiltration using a 0.2 micron filter made of Teflon (registered aligner MA 8 manufactured by SUSS MICROTEC, the heating after exposure and soaking in the 2.38% aqueous solution of tetramethylammonium hydroxide were also carried out in succession. The coat film remained after this operation was further heated using an oven of 220° C. for 1 hour to obtain a cured coat film. By making use of the cured coat films, insulation performance and adhesiveness of each coat film were measured as described in Table 2. Evaluation of adhesiveness carried out by leaving the silicon wafer/copper substrate in a pressure cooker of saturated pressure for 24 hours and then measuring the number of peelings using a lattice pattern peeling test. The insulation breaking strength was measured based on JIS C 2103.

TABLE 1

| | Component (A) | Component (B) | Component (C) | Component (E) | Additive agent | Film thickness after spin coating | Film thickness after development | Exposure amount | Resolving performance |
|---|---|---|---|---|---|---|---|---|---|
| Example 1 | A-1<br>100 | B-1<br>10 | C-1<br>2 | E-1<br>400 | — | 1.9 μm | 1.8 μm | 600 mJ | 6 μm |
| Example 2 | A-1<br>100 | B-2<br>15 | C-1<br>3 | E-1<br>200 | D-1<br>15 | 4.2 μm | 4.1 μm | 1000 mJ | 6 μm |
| Example 3 | A-2<br>100 | B-1<br>10 | C-1<br>2 | E-1<br>80 | D-2<br>15 | 31.0 μm | 29.8 μm | 800 mJ | 30 μm |
| Example 4 | A-2<br>100 | B-1<br>10 | C-1<br>2 | E-1<br>100 | D-1<br>20 | 14.5 μm | 14.4 μm | 600 mJ | 10 μm |
| Example 5 | A-3<br>100 | B-1<br>10 | C-1<br>2 | E-1<br>150 | D-2<br>20 | 7.2 μm | 7.0 μm | 800 mJ | 10 μm |
| Example 6 | A-4<br>100 | B-1<br>10 | C-2<br>2 | E-1<br>120 | D-3<br>15 | 9.5 μm | 9.4 μm | 600 mJ | 10 μm |
| Comp. Ex. 1 | A'-1<br>100 | B-1<br>10 | C-1<br>2 | E-1<br>100 | D-1<br>15 | 11.3 μm | All dissolved | — | — |
| Comp. Ex. 2 | A'-2<br>100 | B-1<br>10 | C-1<br>2 | E-1<br>100 | D-1<br>15 | 12.5 μm | Not developable | — | — |

(In the Table 1, amounts of respective components are described in terms of parts by mass.)

B-1: hexamethoxymethylolmelamine

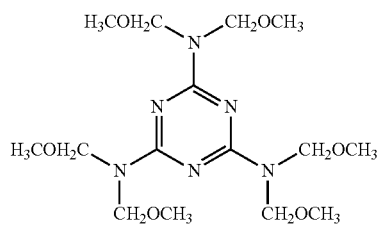

B-2: tetrakis(methoxymethyl)glycoluril (NIKALAC MX-270, mfd. by SANWA CHEMICAL CO., LTD.)

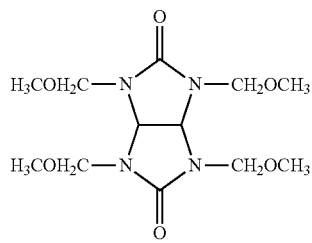

C-1: (p-tolylsulfoniumoxyimino)-p-methoxyphenylacetonitrile

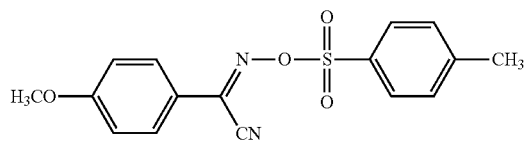 [SMILES: COc1ccc(/C(C#N)=N/OS(=O)(=O)c2ccc(C)cc2)cc1]

C-2: 4-(thiophenoxy)phenyl-diphenylsulfonium hexafluorophosphate

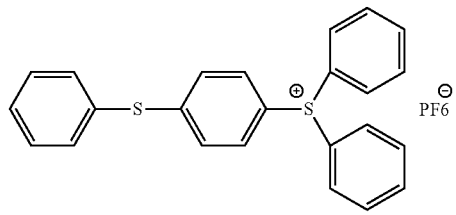

E-1: cyclopentanone

D-1: a bifunctional epoxy resin EPIKOTE 828 (mfd. by Japan Epoxy Resins Co., Ltd.)

D-2: a bifunctional epoxy resin EXA-850CRP (mfd. by Dainippon Ink & Chemicals, Inc.)

D-3: a bifunctional epoxy resin CELLOXIDE 2021P (mfd. by Daicel Chemical Industries, Ltd.)

TABLE 2

| Examples | Adhesiveness | | Electric characteristics |
|---|---|---|---|
| | Si wafer | Copper substrate | Insulation breaking strength |
| Example 1 | 0/100 | 0/100 | 300 V/μm |
| Example 2 | 0/100 | 0/100 | 300 V/μm |
| Example 3 | 0/100 | 0/100 | 300 V/μm |
| Example 4 | 0/100 | 0/100 | 300 V/μm |
| Example 5 | 0/100 | 0/100 | 300 V/μm |
| Example 6 | 0/100 | 0/100 | 300 V/μm |

Based on the above results, it was found that the compositions of Examples 1 to 6 do not cause film loss over a broad range of film thickness exceeding a film thickness of 20 μm and show good resolving power and sufficient characteristics as a photosensitive material, and their cured films have good adhesiveness for various base materials and electric characteristics such as insulation breaking strength and therefore are useful as protective films of circuits and electronic parts.

Preparation of Film-Shaped Adhesives

Examples 7 to 12, Comparative Example 3 and Reference Example 1

Compositions were prepared using the polyimide silicones A-1 to A'-1 synthesized in Synthesis Examples 1 to 5 as the component (A) and blending other components described in Tables 3 and 4. Film-shaped adhesives were prepared by coating each of these compositions on a PET film to a thickness of 20 μm, drying it at 100° C. using a dryer and then laminating a polyethylene cover film thereon. Evaluations were carried out by the following methods.

Evaluation of Patterning Property

Cover film of the film-shaped adhesive prepared was peeled off, and a 6 inch silicon wafer and the film-shaped adhesive were pasted together and compressed with a roller. Thereafter, a substrate in which the film-shaped adhesive was transferred onto the silicon wafer was prepared by peeling off PET film of the base material. After carrying out exposure on this adhesive at 600 mJ (illumination intensity measured at 365 nm) via a photomask for negative use on which a 10 millimeters square pattern had been designed, un-exposed portions were dissolved and removed by soaking it in a 2.38% aqueous solution of tetramethylammonium hydroxide for 5 minutes. Consequently, a square pattern was formed, and a case in which change in film thickness of the pattern became within the range of ±10% of the film thickness before exposure was regarded as A, and a case of exceeding ±10% but ±20% or less as B, and a case of exceeding ±20% as C. In this connection, a mask aligner MA 8 manufactured by SUSS MICROTEC was used for the exposure and the light source wavelength was set to a broad band.

Evaluation of Adhesiveness

A patterned substrate after development was heated in advance at 150° C. on a hot plate, and a 6 inch glass substrate alone was put thereon and pasted by applying a load from the above. The loading pressure was set to 0.2 MPa, and the loading time to 3 minutes. Thereafter, heat curing was carried out at 200° C. for 1 hour in an oven and then adhering conditions between the pattern surface and glass substrate were observed under an optical microscope. A case in which an abnormal junction such as voids and the like was found in entire interface was regarded as C, and a case in which they were uniformly pasted together but partially containing voids as B and a case in which they were closely and uniformly pasted together without any void as A.

Evaluation of Reliability

The silicon-glass substrate pasted together by the above-mentioned procedure was exposed to an atmosphere of 85° C. in temperature and 85% in humidity for 200 hours and then heated using an oven of 260° C. for 20 seconds. After cooling to room temperature, adhering conditions of the interface were observed under an optical microscope in the same manner as in the above. A case in which an abnormal junction such as voids and the like was found in the interface was regarded as C, and a case in which they were closely and uniformly pasted together as A.

TABLE 3

| | | Example 7 | Example 8 | Example 9 | Example 10 |
|---|---|---|---|---|---|
| Component (A) | A-1 | 100 | | | |
| | A-2 | | 100 | | |
| | A-3 | | | 100 | |
| | A-4 | | | | 100 |
| | A'-1 | | | | |
| Component (B) | B-1 | 10 | 15 | 5 | 10 |
| | B-2 | | | | |
| Component (C) | C-1 | 3 | 3 | 2 | |
| | C-2 | | | | 2 |
| Component (D) | D-1 | 15 | 15 | | |
| | D-4 | | | 10 | |
| | D-3 | | | | 10 |
| Solvent (cyclopentanone) | | 100 | 100 | 100 | 100 |
| Evaluation results | Patterning property | A | A | A | A |
| | Adhesiveness | A | A | A | A |
| | Reliability | A | A | A | A |

TABLE 4

| | | Ex. 11 | Comp. Ex. 3 | Ex. 12 |
|---|---|---|---|---|
| Component (A) | A-1 | | | |
| | A-2 | | | 100 |
| | A-3 | | | |
| | A-4 | 100 | | |
| | A'-1 | | 100 | |
| Component (B) | B-1 | | 10 | |
| | B-2 | 5 | | 10 |
| Component (C) | C-1 | 3 | 3 | 2 |
| | C-2 | | | |
| Component (D) | D-1 | | 15 | |
| | D-4 | 15 | | |
| | D-3 | | | 120 |
| Solvent (cyclopentanone) | | 100 | 100 | 100 |
| Evaluation results | Patterning property | A | C | B |
| | Adhesiveness | A | — | B |
| | Reliability | A | — | — |

(In the Tables 3 and 4, amounts of respective components are described in terms of parts by mass.)

In this connection, the components B-1, B-2, C-1, C-2, D-1 and D-3 in Table 3 and Table 4 are as described in the foregoing. In addition, the component D-4 is 1,2,3,4-tetrakis(glycidoxypropyl)-1,2,3,4-tetramethylcyclotetrasiloxane, which is a tetra-functional epoxy silicone.

While the invention has been described in detail and with reference to specific embodiments thereof, it will be apparent to one skilled in the art that various changes and modifications can be made therein without departing from the spirit and scope of the invention.

In this connection, this application is based on a Japanese patent application No. 2009-280569 filed on Dec. 10, 2009 and a Japanese patent application No. 2009-280570 filed on Dec. 10, 2009, the entire contents thereof being thereby incorporated by reference.

What is claimed is:

1. A photo-curable resin composition, which comprises:
   as a component (A), a polyimide silicone having a primary alcoholic hydroxyl group, represented by the following general formula:

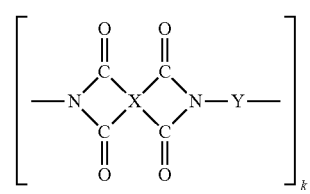

-continued

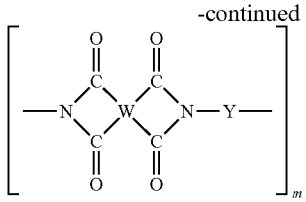

wherein
k an m are each a positive integer, in which k and m satisfy a relation of $0.01 \leq k/(k+m) < 1$;
X is a tetravalent organic group represented by the following general formula:

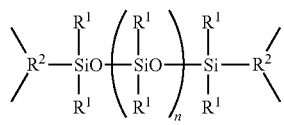

wherein $R^1$'s are each independently a monovalent hydrocarbon group having 1 to 8 carbon atoms, $R^2$'s are each independently a trivalent organic group, and N is a numeral of 1 to 120 in average;
Y's are each a divalent organic group and at least s part thereof is represented by the following general formula:

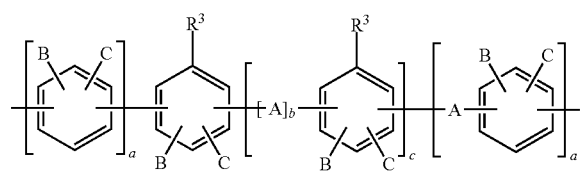

wherein A('s) is/are each a divalent organic group selected from: $-CH_2-$, $-O-$, $-SO_2-$, $-CONH-$,

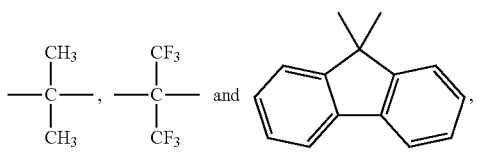

which may be the same or different from each other, B('s) and C('s) are each an alkyl group having 1 to 4 carbon atoms or a hydrogen atom, which may be the same or different from each other, a is 0 or 1, b is 0 or 1, c is an integer of 0 to 10, and $R^3$('s) is/are each a monovalent group selected from organic groups containing a phenolic hydroxyl group or an alcoholic hydroxyl group, in which at least one of $R^3$'s is an organic group containing a primary alcoholic hydroxyl group; and
W is a tetravalent organinc group other than X;
as a component (B), at least one compound selected from the group consisting of an amino condensation product modified with formalin or a formalin-alcohol and a phenol compound having two or more in average of methylol group or alkoxymethylol group in one molecule thereof; and
as a component (C), a photo-acid generator.

2. The photo-curable resin composition according to claim 1, which comprises 100 parts by mass of the component (A), from 0.5 part by mass to 50 parts by mass of the component (B) and from 0.05 part by mass to 20 parts by mass of the component (C).

3. The photo-curable resin composition according to claim 1, which further comprises from 50 parts by mass to 2,000 parts by mass of an organic solvent as a component (E), based on 100 parts by mass in total amount of the components (A) to (C).

4. The photo-curable resin composition according to claim 1, wherein the polyimidesilicone is a polyimidesilicone represented by the following general formula (1-1):

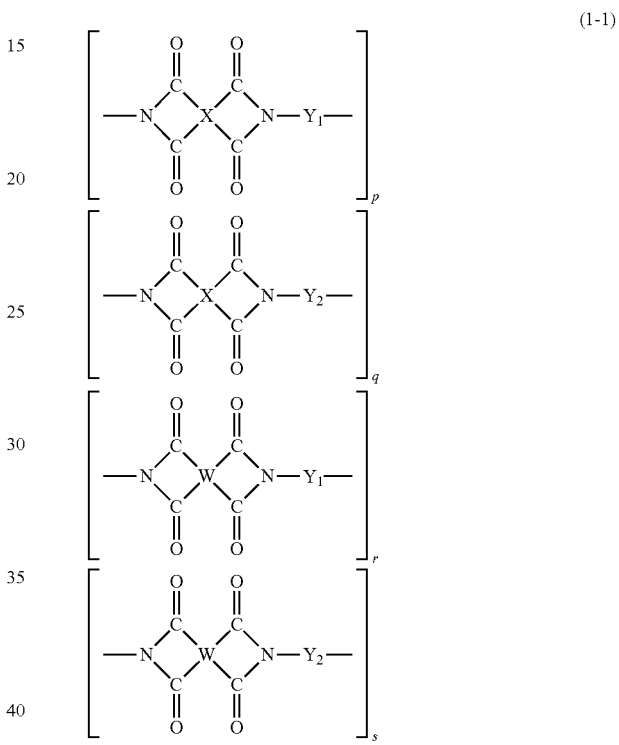

wherein X and W are the same as above; $Y_1$'s are each a divalent organic group represented by the general formula (3); and $Y_2$'s are each a divalent organic group other than the group represented by the general formula (3); and p and r are each a positive integer, and q and s are each 0 or a positive integer, in which p, q, r and s satisfy relations of $p+q=k$ and $r+s=m$ (wherein k and m are the same as above).

5. The photo-curable resin composition according to claim 1, wherein in at least one of $R^3$'s is a monovalent group selected from $-OH$, $-OCH_2CH(OH)CH_2OH$ and $-OCH(CH_2OH)CH_2OH$.

6. The photo-curable resin composition according to claim 1, wherein W is one of tetravalent organic groups represented by the following formulae:

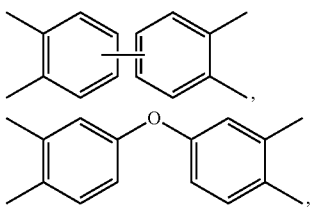

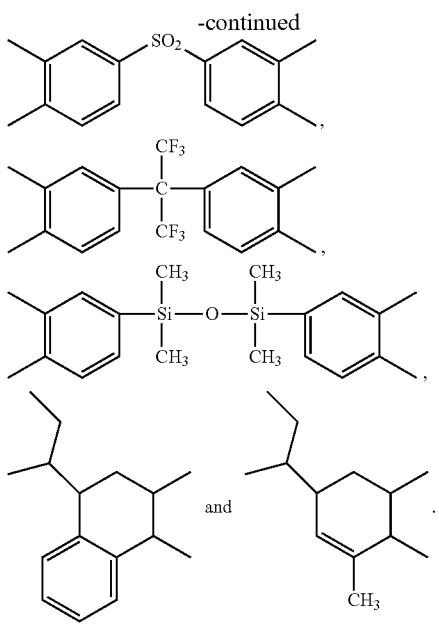

7. The photo-curable resin composition according to claim 1, wherein the polyimidesilicone has an OH value of 20 to 200 KOH mg/g.

8. The photo-curable resin composition according to claim 4, wherein in the general formula (1-1), $Y_2$'s are at least one selected from a divalent organic group represented by the following general formula (4):

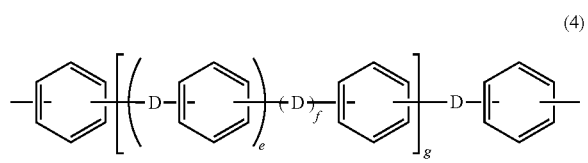

(4)

wherein D('s) is/are each independently any of the following divalent organic groups: —$CH_2$—, —O—, —$SO_2$—, —CONH—,

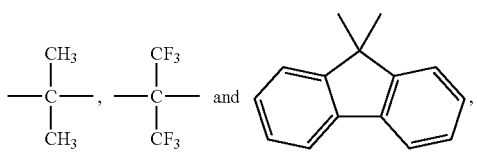

and e and f are each independently 0 or 1 and g is 0 or 1; and a divalent organic group represented by the following general formula (5)

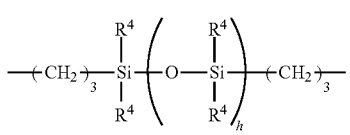

(5)

wherein $R^4$'s are each independently a monovalent hydrocarbon group having 1 to 8 carbon atoms and h is an integer of 1 to 80.

9. The photo-curable resin composition according to claim 1, wherein the polyimidesilicone has a phenol group, a thiol group or a carboxyl group at a terminal end thereof.

10. The photo-curable resin composition according to claim 1, which further comprises a multifunctional epoxy compound as a component (D).

11. The photo-curable resin composition according to claim 10, which comprises 100 parts by mass of the component (A), from 0.5 part by mass to 50 parts by mass of the component (B), from 0.05 part by mass to 20 parts by mass of the component (C) and from 0.05 part by mass to 100 parts by mass of the component (D).

12. The photo-curable resin composition according to claim 10, which further comprises from 50 parts by mass to 2,000 parts by mass of an organic solvent as a component (E), based on 100 parts by mass in total amount of the components (A) to (D).

13. The photo-curable resin composition according to claim 10, wherein the component (D) is at least one multifunctional epoxy compound selected from the group consisting of a multifunctional epoxy compound having bisphenol structure, a phenol novolak multifunctional epoxy compound and a multifunctional epoxy silicone.

14. A method for forming a pattern, which comprises (i) forming a film of the photo-curable resin composition according to claim 1 on a substrate, (ii) exposing said film to a light having a wavelength of from 240 nm to 500 nm via a photomask, and (iii) carrying out development using a developing solution.

15. The method according to claim 14, which further comprises carrying out a heating treatment after the exposure step (ii) but before the developing step (iii).

16. A protective coat film, which is obtained by forming a pattern by:

forming a film of a photo-curable resin composition comprising (A) a polyimide silicone having a primary alcoholic hydroxyl group, represented by the following general formula:

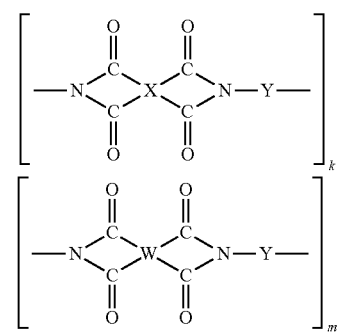

wherein
k an m are each a positive integer, in which k and m satisfy a relation of $0.01 \leq k/(k+m) <1$;
X is a tetravalent organic group represented by the following general formula:

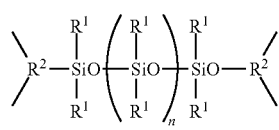

wherein $R^1$'s are each independently a monovalent hydrocarbon group having 1 to 8 carbon atoms, $R^2$'s are each independently a trivalent organic group, and N is a numeral of 1 to 120 in average;

Y's are each a divalent organic group and at least s part thereof is represented by the following general formula:

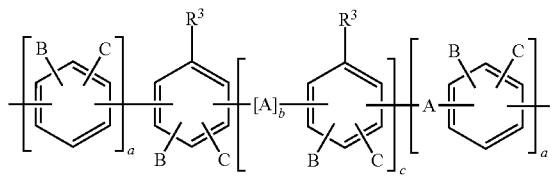

wherein A('s) is/are each a divalent organic group selected from: —$CH_2$—, —O—, —$SO_2$—, —CONH—,

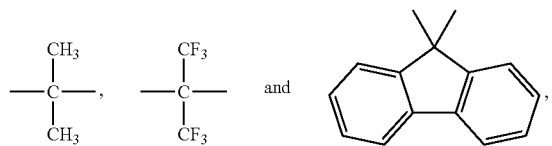

which may be the same or different from each other, B('s) and C('s) are each an alkyl group having 1 to 4 carbon atoms or a hydrogen atom, which may be the same or different from each other, a is 0 or 1, b is 0 or 1, c is an integer of 0 to 10, and $R^3$('s) is/are each a monovalent group selected from organic groups containing a phenolic hydroxyl group or an alcoholic hydroxyl group, in which at least one of $R^3$'s is an organic group containing a primary alcoholic hydroxyl group; and W is a tetravalent organinc group other than X;

(B) at least one compound selected from the group consisting of an amino condensation product modified with formalin or a formalin-alcohol and a phenol compound having two or more on average of methylol groups or alkoxymethylol groups in one molecule thereof, and (C) a photo-acid generator on a substrate;

exposing said film to a light having a wavelength of from 240 nm to 500 nm via a photomask in order to cure the portion of the composition which is not covered by the photomask;

removing the photomask; and carrying out development using a developing solution in order to remove from the substrate the portion of composition which was covered by the substrate, and subsequently curing the pattern at a temperature within a range of from 70° C. to 300° C.

17. A film-shaped adhesive, which is prepared by forming the photo-curable resin composition according to claim 10 into a film shape.

18. An adhesive sheet, which comprises:

(I) a base material film layer, (II) a photo-curable resin layer prepared by forming the photo-curable resin composition according to claim 10 into a film shape having a film thickness of from 0.1 μm to 200 μm, and (III) a cover film layer.

* * * * *